US012785254B2

(12) United States Patent
Lim et al.

(10) Patent No.: US 12,785,254 B2
(45) Date of Patent: Nov. 3, 2026

(54) ANTENNA AND ELECTRONIC DEVICE COMPRISING ANTENNA

(71) Applicant: SAMSUNG ELECTRONICS CO., LTD., Suwon-si (KR)

(72) Inventors: Youngkon Lim, Suwon-si (KR); Kihyuk Han, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/957,050

(22) Filed: Nov. 22, 2024

(65) Prior Publication Data

US 2025/0087870 A1 Mar. 13, 2025

Related U.S. Application Data

(63) Continuation of application No. PCT/KR2023/006979, filed on May 23, 2023.

(30) Foreign Application Priority Data

May 23, 2022 (KR) ........................ 10-2022-0063016
Jul. 5, 2022 (KR) ........................ 10-2022-0082237

(51) Int. Cl.
*H01Q 1/24* (2006.01)
*H01Q 1/52* (2006.01)
*H05K 1/02* (2006.01)

(52) U.S. Cl.
CPC ............. *H01Q 1/243* (2013.01); *H01Q 1/526* (2013.01); *H05K 1/028* (2013.01); *H05K 2201/10098* (2013.01)

(58) Field of Classification Search
CPC ............ H01Q 1/24; H01Q 1/243; H01Q 1/52; H01Q 1/526
See application file for complete search history.

(56) References Cited

U.S. PATENT DOCUMENTS 7,598,867 B2 10/2009 Carrender
8,814,056 B2 8/2014 Kato
(Continued)

FOREIGN PATENT DOCUMENTS

CN 110581362 A 12/2019
CN 113904104 A 1/2022
(Continued)

OTHER PUBLICATIONS

Extended European Search Report issued Jul. 7, 2025 by the European Patent Office for EP Patent Application No. 23812107.3.
(Continued)

*Primary Examiner* — Hoang V Nguyen
(74) *Attorney, Agent, or Firm* — Sughrue Mion, PLLC

(57) ABSTRACT

An electronic device includes: a housing including a front surface and a rear surface; a display on the front surface of the housing; a shielding member being inside the housing; a printed circuit board on the shielding member, including: a first antenna area including a first pattern, a second antenna area including a second pattern, and a bending area, which is at least partially bent to interconnect the first antenna area and the second antenna area; and a rear surface plate on the rear surface of the housing to cover the printed circuit board, wherein the second pattern extends to outside of the first pattern and at least partially faces a portion of the first pattern.

13 Claims, 16 Drawing Sheets

(56) References Cited

U.S. PATENT DOCUMENTS

| | | | |
|---|---|---|---|
| 9,893,424 B2 | 2/2018 | Han et al. | |
| 2007/0222602 A1 | 9/2007 | Luo et al. | |
| 2010/0052996 A1 | 3/2010 | Ochi et al. | |
| 2015/0381225 A1 | 12/2015 | Lee et al. | |
| 2017/0005399 A1 | 1/2017 | Ito et al. | |
| 2018/0316782 A1 | 11/2018 | Choi et al. | |
| 2023/0216199 A1* | 7/2023 | Oh | H04M 1/026<br>343/702 |

FOREIGN PATENT DOCUMENTS

| | | | |
|---|---|---|---|
| JP | 2017-17536 | A | 1/2017 |
| KR | 10-1098263 | B1 | 12/2011 |
| KR | 10-2016-0002070 | A | 1/2016 |
| KR | 10-2022-0036077 | A | 3/2022 |

OTHER PUBLICATIONS

Communication issued on Sep. 3, 2026 by the Korean Ministry of Intellectual Property (MOIP) in Korean Patent Application No. 10-2022-0082237.

* cited by examiner

ANTENNA AND ELECTRONIC DEVICE COMPRISING ANTENNA

CROSS-REFERENCE TO RELATED APPLICATIONS

This application is a by-pass continuation application of International Application No. PCT/KR2023/006979, filed on May 23, 2023, which is based on and claims priority to Korean Patent Application Nos. 10-2022-0063016, filed on May 23, 2022, and 10-2022-0082237, filed on Jul. 5, 2022, in the Korean Intellectual Property Office, the disclosures of which are incorporated by reference herein their entireties.

BACKGROUND

1. Field

The disclosure relates to an antenna and an electronic device including the same.

2. Description of Related Art

Recently, electronic devices have supported various types of wireless communication methods. Typically, the electronic devices are capable of supporting short-range wireless communication technology. Electronic devices may include separate antennas to support various types of wireless communications, or may include antennas that are capable of supporting different types of wireless communications in an integrated manner.

An electronic device may include therein a plurality of antennas (coils) to support short-range wireless communication technology such as near-field communication (NFC), magnetic secure transmission (MST), or wireless charging. With the development of short-range wireless communication technology, the frequency of use of short-range wireless communication technology is increasing. Accordingly, antennas with a wider operating range are required to ensure compatibility with short-range wireless communication technology.

SUMMARY

Provided are an electronic device that is configured to extend the operating range of an antennas supporting short-range wireless communication technology and a method performed by the electronic device.

According to one or more embodiments disclosed herein, the operating range of a short-range wireless communication antenna can be extended by modifying the structure of a flexible printed circuit board (FPCB) used for short-range wireless communication.

According to an aspect of the disclosure, an electronic device includes: a housing including a front surface and a rear surface; a display on the front surface of the housing; a shielding member being inside the housing; a printed circuit board on the shielding member, including: a first antenna area including a first pattern, a second antenna area including a second pattern, and a bending area, which is at least partially bent to interconnect the first antenna area and the second antenna area; and a rear surface plate on the rear surface of the housing to cover the printed circuit board, wherein the second pattern extends to outside of the first pattern and at least partially faces a portion of the first pattern.

According to an aspect of the disclosure, a printed circuit board includes: a first antenna area on a shielding member included in an electronic device and including a first pattern; a second antenna area including a second pattern that extends to outside of the first pattern and at least partially faces a portion of the first pattern as the second antenna area is folded from inside to outside of the first antenna area; and a bending area at least partially bent to interconnect the first antenna area and the second antenna area.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Figure 1:
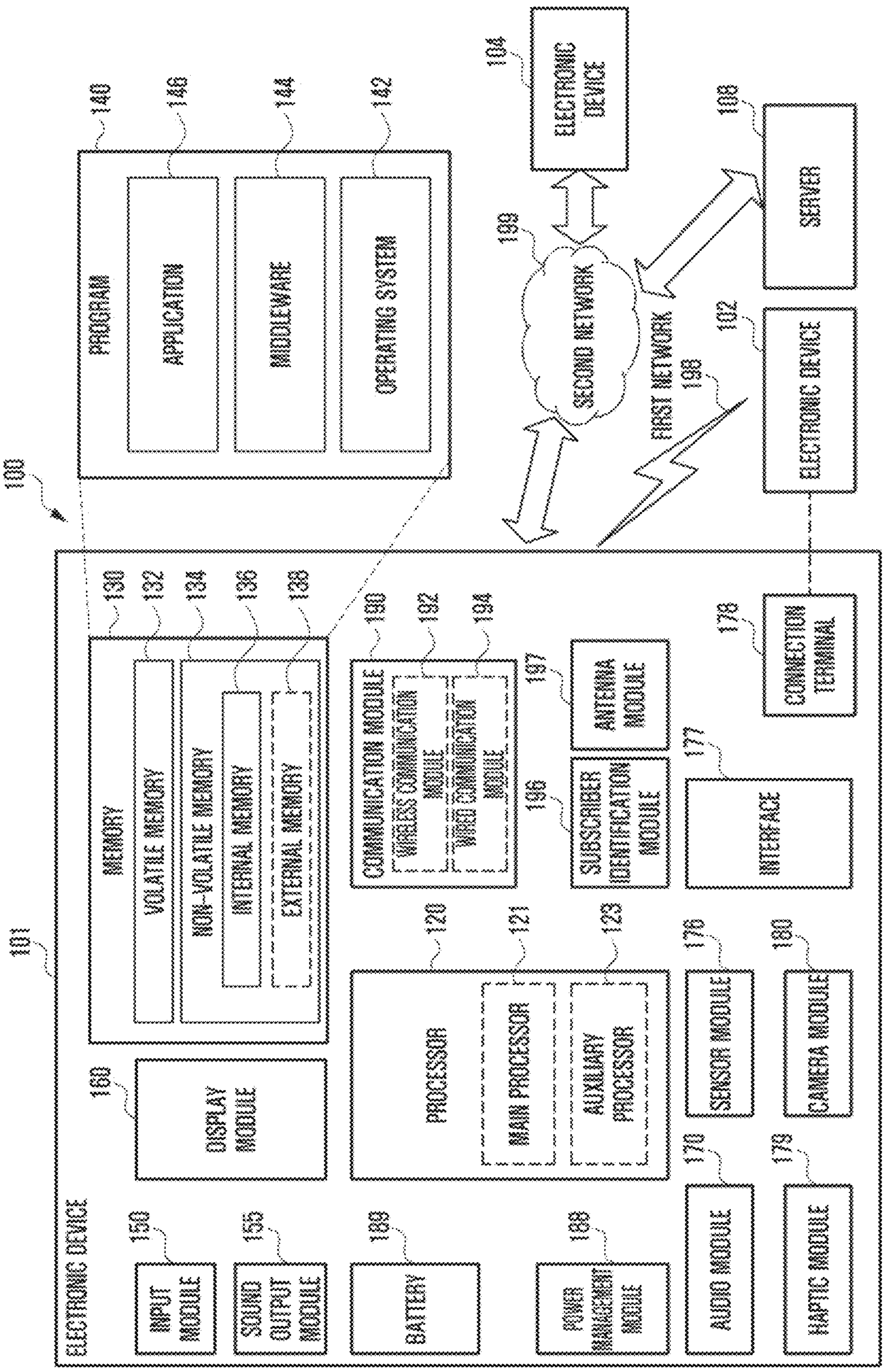
FIG. 1 is a block diagram of an electronic device according to one or more embodiments in a network environment.

FIG. 1 is a block diagram illustrating an electronic device 101 in a network environment 100 according to one or more embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly.

According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to one or more embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
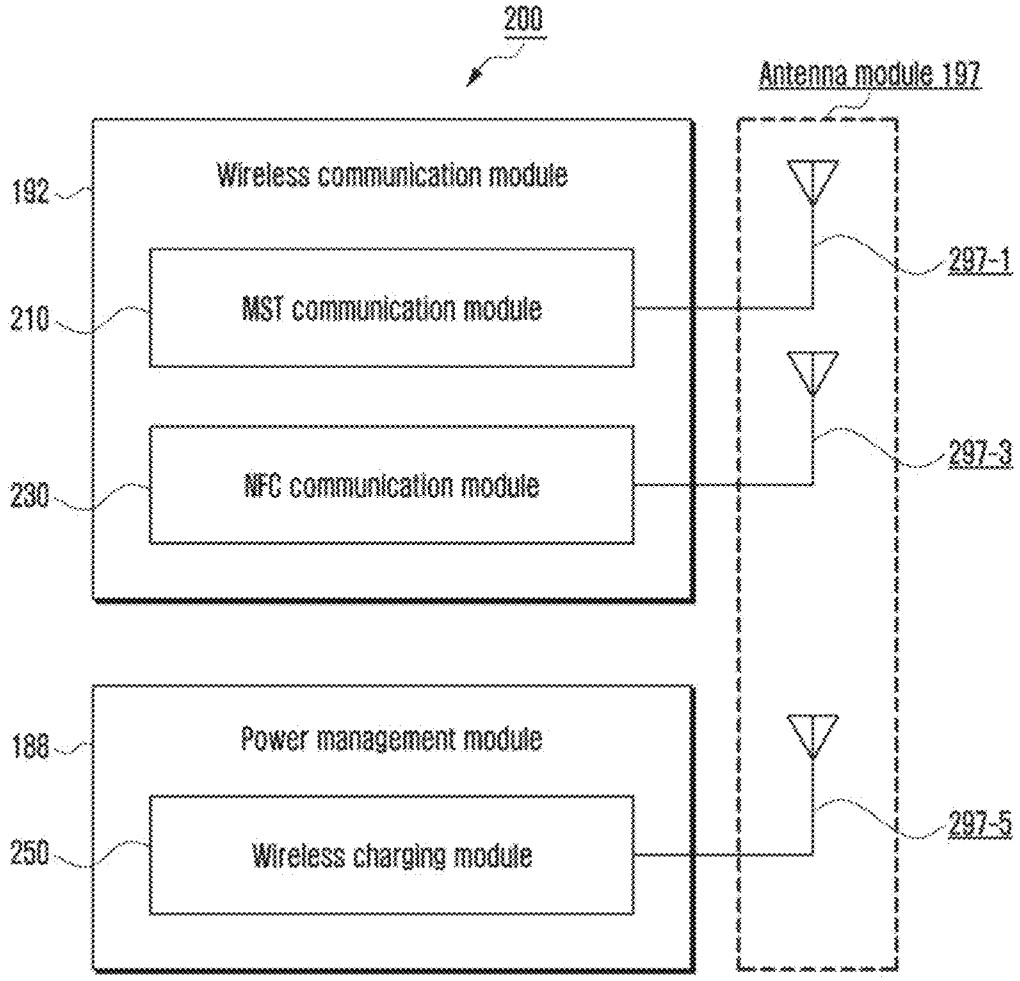
FIG. 2 is a block diagram illustrating a wireless communication module, a power management module, and an antenna module of an electronic device according to one or more embodiments.

FIG. 2 is a block diagram 200 illustrating the wireless communication module 192, the power management module 188, and the antenna module 197 of the electronic device 101 according to one or more embodiments. Referring to FIG. 2, the wireless communication module 192 may include a magnetic secure transmission (MST) communication module 210 or a near-field communication (NFC) module 230, and the power management module 188 may include a wireless charging module 250. In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to an embodiment, the MST communication module 210 may include a switching module that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to an embodiment, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to an embodiment, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to an embodiment, at least one function of the MST communication module 210, the NFC communication module 230, or the wireless charging module 250 may be controlled by an external processor (e.g., the processor 120). According to an embodiment, at least one specified function (e.g., a payment function) of the MST communication module 210 or the NFC communication module 230 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

Figure 3A:
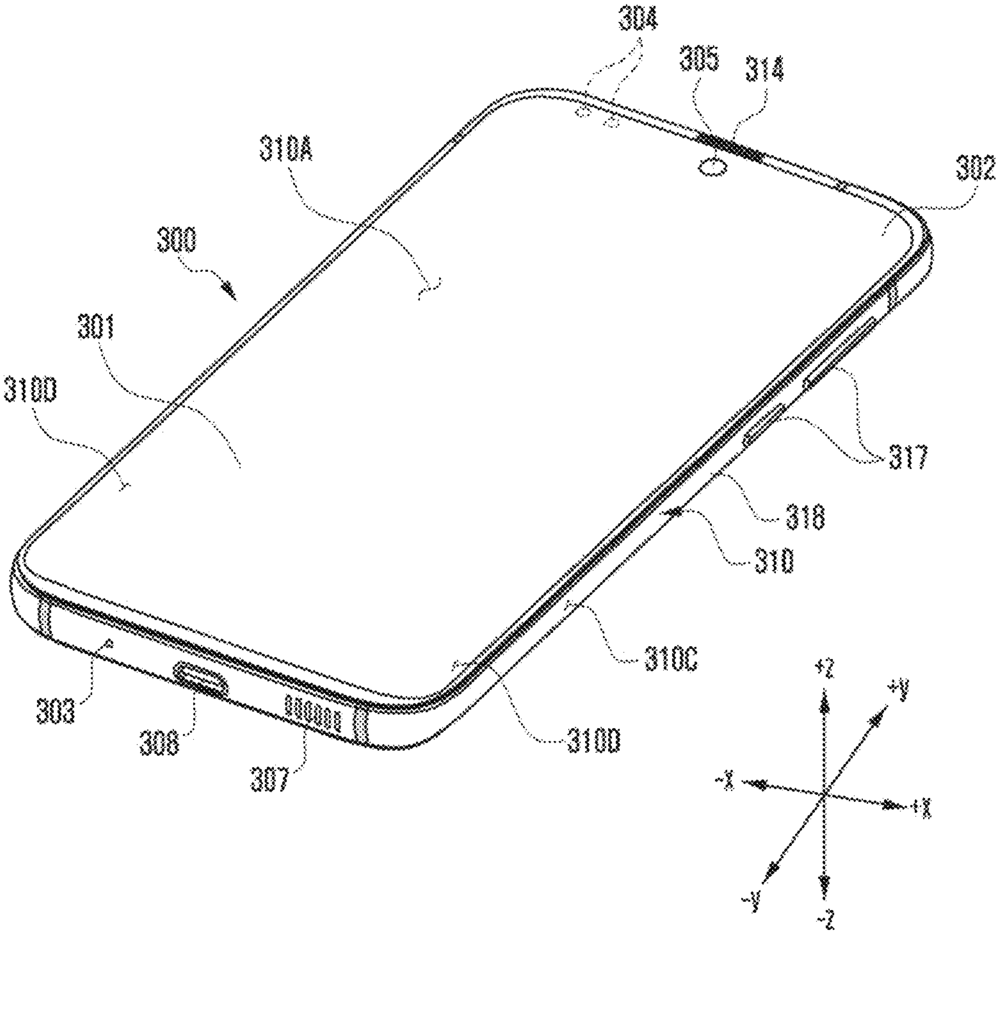
FIG. 3A is a front perspective view of an electronic device according to one or more embodiments disclosed herein.
Figure 3B:
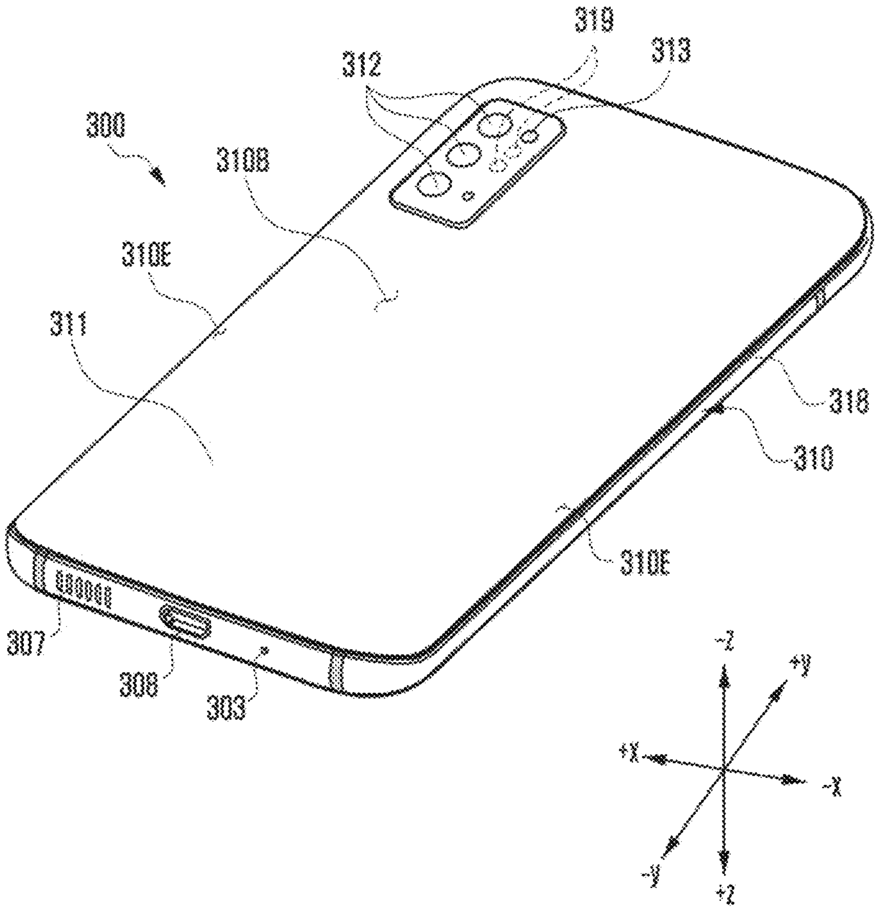
FIG. 3B is a rear perspective view illustrating the electronic device of FIG. 3A, according to one or more embodiments disclosed herein.

FIG. 3A is a front perspective view of an electronic device according to one or more embodiments of the disclosure. FIG. 3B is a rear perspective view illustrating the electronic device of FIG. 3A according to one or more embodiments of the disclosure.

The electronic device 300 described below may include at least one of the components of the electronic device 101 described above with reference to FIG. 1.

Referring to FIGS. 3A and 3B, the electronic device 300 according to an embodiment may include a housing 310 having a first surface (or a front surface) 310A, a second surface (or a rear surface) 310B, and a side surface 310C surrounding a space between the first surface 310A and the second surface 310B. In another embodiment, the term “housing” may refer to a structure defining some of the first surface 310A, the second surface 310B, and the side surface 310C in FIG. 3A. According to an embodiment, at least a portion of the first surface 310A may be made of a substantially transparent front surface plate 302 (e.g., a glass plate or a polymer plate with various coating layers). The second surface 310B may be made of a substantially opaque rear surface plate 311. The rear surface plate 311 may be made of, for example, coated or colored glass, ceramic, polymer, metal (e.g., aluminum, stainless steel (STS), or magnesium), or a combination of two or more of these materials. The side surface 310C may be defined by a side surface bezel structure 318 (or a “side surface member”) coupled to the front surface plate 302 and the rear surface plate 311 and including metal and/or polymer. In some embodiments, the rear surface plate 311 and the side surface bezel structure 318 may be integrally configured and may include the same material (e.g., a metal material such as aluminum).

In the illustrated embodiment, the front surface plate 302 may include, at the opposite long edges thereof, first areas 310D, which are bent from the first surface 310A toward the rear surface plate and extend seamlessly. In the illustrated embodiment (see FIG. 3B), the rear surface plate 311 may include, at the opposite long edges thereof, second areas 310E, which are bent from the second surface 310B toward the front surface plate and extend seamlessly. In some embodiments, the front surface plate 302 or the rear surface plate 311 may include only one of the first areas 310D or the second areas 310E. In some embodiments, the front surface plate 302 may not include the first areas and the second areas, and may include only a flat surface arranged in parallel to the second surface 310B. In the above-described embodiments, when viewed from a side of the electronic device, the side surface bezel structure 318 may have a first thickness (or width) on the side surfaces where the first areas 310D or the second areas 310E are not included, and may have a second thickness smaller than the first thickness, on the side surfaces where the first areas 310D or the second areas 310E are included.

According to an embodiment, the electronic device 300 may include at least one of a display 301, an input device 303, sound output devices 307 and 314, sensor modules 304 and 319, camera modules 305 and 312, key input devices 317, an indicator, or a connector 308. In some embodiments, in the electronic device 300, at least one of the components (e.g., the key input devices 317 or the indicator) may be omitted, or other components may be additionally included.

The display 301 may be visually exposed through a substantial portion of, for example, the front surface plate 302. In some embodiments, at least a portion of the display 301 may be visually exposed through the front surface plate 302, which defines the first surface 310A and the first areas 310D of the side surface 310C. The display 301 may be coupled to or disposed adjacent to a touch-sensitive circuit, a pressure sensor capable of measuring touch intensity (pressure), and/or a digitizer panel configured to detect a magnetic field-type electronic pen. In some embodiments, at least some of the sensor modules 304 and 319 and/or at least some of the key input devices 317 may be disposed in the first areas 310D and/or the second areas 310E.

The input device 303 may include a microphone 303. In some embodiments, the input device 303 may include a plurality of microphones 303 arranged to detect the direction of sound. The sound output devices 307 and 314 may include speakers 307 and 314. The speakers 307 and 314 may include an external speaker 307 and a communication receiver 314. In some embodiments, the microphone 303, the speakers 307 and 314, and the connector 308 may be at least partially disposed in the inner space of the electronic device 300, and may be exposed to the external environment through at least one hole provided in the housing 310. In some embodiments, the hole provided in the housing 310 may be commonly used for the microphone 303 and the speakers 307 and 314. In some embodiments, the sound output devices 307 and 314 may include a speaker that operates without a hole in the housing 310 (e.g., a piezo speaker).

The sensor modules 304 and 319 may generate electrical signals or data values corresponding to an internal operating state or an external environmental state of the electronic device 300. The sensor modules 304 and 319 may include, for example, a first sensor module 304 (e.g., a proximity sensor) and/or a second sensor module (e.g., a fingerprint sensor) disposed on the first surface 310A of the housing 310, and/or a third sensor module 319 (e.g., an HRM sensor) disposed on the second surface 310B of the housing 310. The fingerprint sensor may be disposed on the first surface 310A of the housing 310 (e.g., a home key button), in a partial area of the second surface 310B, and/or under the display 301. The electronic device 300 may further include at least one of sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, a proximity sensor, or an illuminance sensor.

The camera modules 305 and 312 may include a first camera module 305 disposed on the first surface 310A of the electronic device 300, a second camera module 312 disposed on the second surface 310B, and/or a flash 313. The camera modules 305 and 312 may include one or more lenses, an image sensor, and/or an image signal processor. The flash 313 may include, for example, a light-emitting diode or a xenon lamp. According to some embodiments, two or more lenses (e.g., a wide-angle lens, a super-wide-angle lens, and a telephoto lens) and image sensors may be arranged on one surface of the electronic device 300.

The key input devices 317 may be disposed on the side surface 310C of the housing 310. In another embodiment, the electronic device 300 may not include some or all of the above-mentioned key input devices 317, and the key input devices 317, which are not included, may be implemented in another form, such as soft keys, on the display 301. In another embodiment, the key input devices 317 may be implemented using pressure sensors included in the display 301.

The indicator may be disposed, for example, on the first surface 310A of the housing 310. The indicator may provide, for example, the status information of the electronic device 300 in an optical form (e.g., a light-emitting element). In another embodiment, the light-emitting element may provide, for example, a light source that operates in conjunction with the operation of the camera module 305. The indicator may include, for example, an LED, an IR LED, and/or a xenon lamp.

The connector hole 308 may include a first connector hole 308 capable of accommodating a connector (e.g., a universal serial bus (USB) connector) configured to transmit/receive power and/or data to/from an external electronic device, and a second connector hole (e.g., an earphone jack) capable of accommodating a connector configured to transmit/receive an audio signal to/from an external electronic device.

One 305 of the camera modules 305 and 312, one 304 of the sensor modules 304 and 319, or the indicator may be disposed to be exposed through the display 301. For example, the camera module 305, the sensor module 304, or the indicator may be disposed in the inner space of the electronic device 300 to be in contact with the external environment through an opening perforated in the display 301 up to the front surface plate 302 or a transmission area. According to an embodiment, the area where the display 301 and the camera module 305 face each other may be configured as a transmission area with a predetermined transmittance as a portion of a content display area. According to an embodiment, the transmission area may have a transmittance ranging from about 5% to about 20%. The transmission area may include an area overlapping an effective area (e.g., a field of view area) of the camera module 305 through which light passes to form an image on the image sensor. For example, the transmission area of the display 301 may include an area having a lower pixel density than the periphery. For example, the transmission area may replace the opening. For example, the camera module 305 may include an under-display camera (UDC). As another embodiment, some sensor modules 304 may be disposed in the inner space of the electronic device to perform the functions thereof without being visually exposed through the front surface plate 302. For example, in this case, the area of the display 301 facing the sensor module may not require a perforated opening.

According to various embodiment, the electronic device 300 has a bar-type or plate-type exterior, but the disclosure is not limited thereto. For example, the illustrated electronic device 300 may be a portion of a foldable electronic device, a slidable electronic device, a stretchable electronic device, and/or a rollable electronic device. The term "foldable electronic device", the "slidable electronic device", the "stretchable electronic device", and/or the "rollable electronic device" may mean an electronic device in which bending transformation of a display (e.g., the display 430 in FIG. 4) is possible, so that the display can be at least partially folded, wound or rolled, at least partially expanded in area, and/or accommodated inside a housing (e.g., the housing 310 in FIGS. 3A and 3B). The foldable electronic device, the slidable electronic device, the stretchable electronic device, and/or the rollable electronic device may allow a user to use a screen display area in an expanded state by unfolding the display or exposing a greater area of the display to the outside if necessary.

Figure 4:
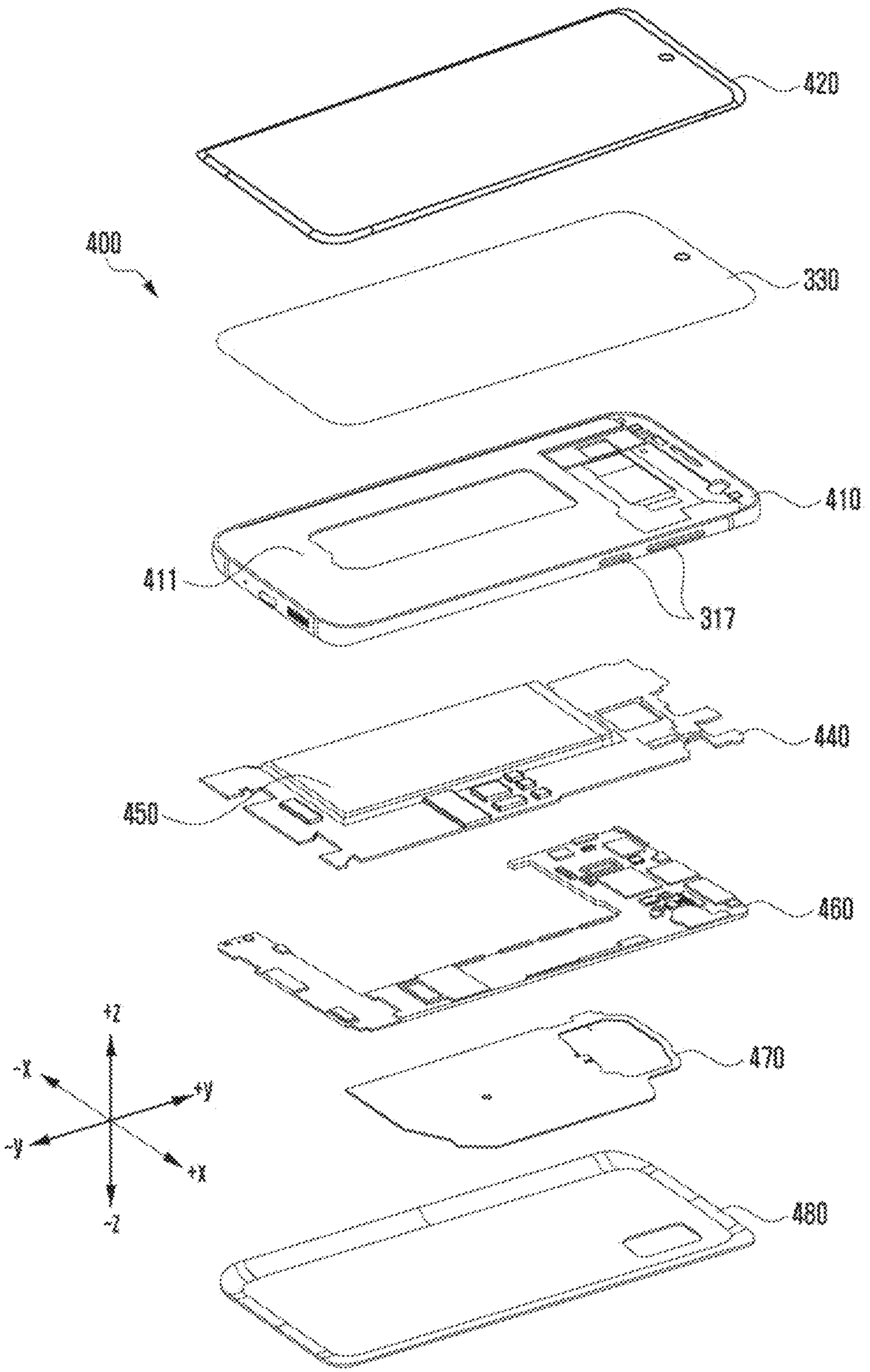
FIG. 4 is an exploded perspective view of the electronic device of FIG. 3A, according to one or more embodiments disclosed herein.

FIG. 4 is an exploded perspective view of the electronic device 300 of FIG. 3A according to one or more embodiments of the disclosure.

The electronic device 400 of FIG. 4 may include another embodiment of an electronic device that is at least partially similar to or different from the electronic device 300 of FIGS. 3A and 3B.

Referring to FIG. 4, the electronic device 400 (e.g., the electronic device in FIG. 3A or FIG. 3B) may include a side surface member 410 (e.g., a side surface bezel structure), a first support member 411 (e.g., a bracket or support structure), a front surface plate 420 (e.g., a front surface cover), a display 430 (e.g., the display 301 in FIG. 3A), a board 440 (e.g., a printed circuit board (PCB), a flexible PCB (FPCB), or a rigid-flexible PCB (RFPCB)), a battery 450, a second support member 460 (e.g., a rear case), an antenna 470, and a rear surface plate 480 (e.g., a rear surface cover). In some embodiments, in the electronic device 400, at least one of the components (e.g., the first support member 411 or the second support member 460) may be omitted, or other components may be additionally included. At least one of the components of the electronic device 400 may be the same as or similar to at least one of the components of the electronic device 300 of FIG. 3A or FIG. 3B, and a redundant description will be omitted below.

The first support member 411 may be disposed inside the electronic device 400, and may be connected to the side member 410 or may be integrated with the side surface member 410. The first support member 411 may be made of, for example, a metal material and/or a non-metal (e.g., polymer) material. The first support member 411 may include one surface to which the display 430 is coupled and the other surface to which the board 440 is coupled. A processor, memory, and/or an interface may be mounted on the board 440. The processor may include, for example, one or more of a central processing unit, an application processor, a graphics processing unit, an image signal processor, a sensor hub processor, or a communication processor.

The memory may include, for example, volatile memory or non-volatile memory.

The interface may include, for example, a high-definition multimedia interface (HDMI), a universal serial bus (USB) interface, an SD card interface, and/or an audio interface. The interface may electrically or physically connect, for example, the electronic device 400 to an external electronic device, and may include a USB connector, an SD card/MMC connector, or an audio connector.

The battery 450 is a device for supplying power to at least one component of the electronic device 400 and may include, for example, a non-rechargeable primary battery, a rechargeable secondary battery, or a fuel cell. At least a portion of the battery 450 may be disposed to be substantially flush with, for example, the board 440. The battery 450 may be integrally placed inside the electronic device 400. In another embodiment, the battery 450 may be disposed to be detachable from the electronic device 400.

The antenna 470 may be disposed between the rear surface plate 480 and the battery 450. The antenna 470 may include, for example, a near-field communication (NFC) antenna, a wireless charging antenna, and/or a magnetic secure transmission (MST) antenna. For example, the antenna 470 may execute short-range communication with an external device or may transmit/receive power required for charging to/from an external device in a wireless manner. In another embodiment, an antenna structure may be configured with a portion or a combination of the side surface bezel structure 410 and/or the first support member 411.

Since an electronic device described below includes similar components to the electronic device 400 described above (e.g., the electronic device 101 in FIG. 1 and the electronic device 300 in FIG. 3A), detailed descriptions of overlapping components will be omitted. Unless necessary, identical or similar components will be described using the same member number.

Figure 5A:
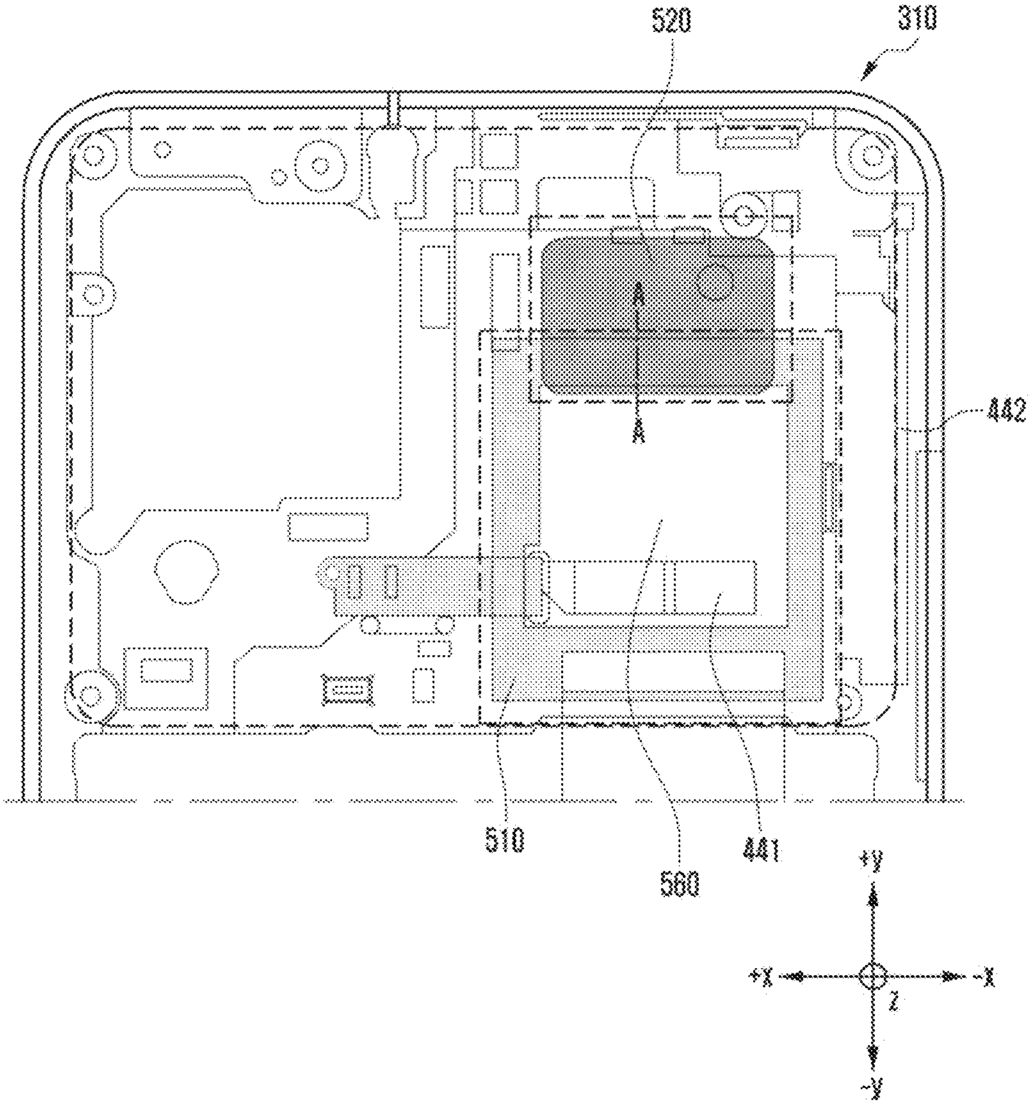
FIG. 5A is a view illustrating a printed circuit board disposed on the rear surface of an electronic device according to one or more embodiments disclosed herein.
Figure 5B:
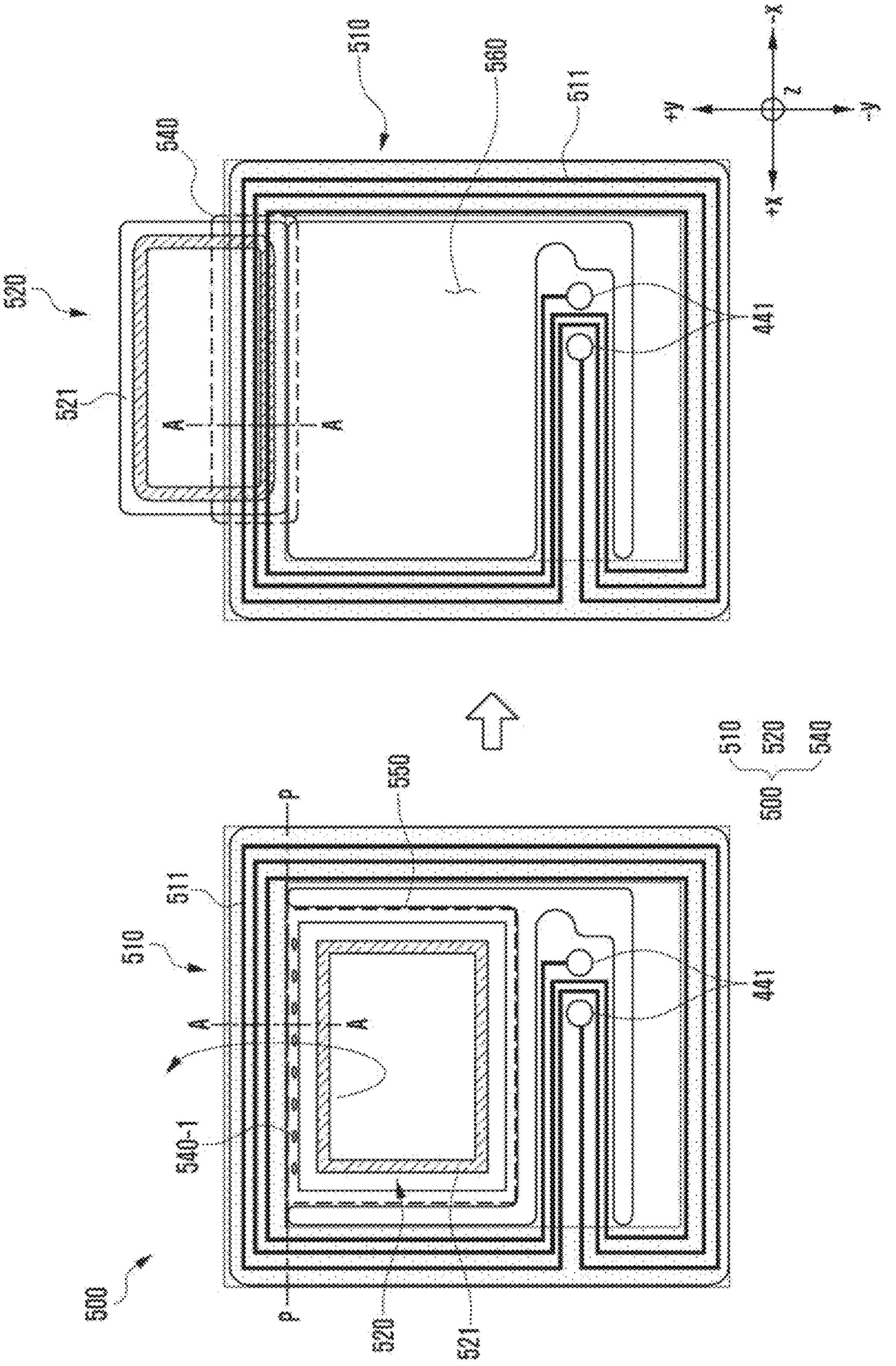
FIG. 5B is a view illustrating a process of folding a printed circuit board illustrated in FIG. 5A along a folding axis P-P.
Figure 5C:
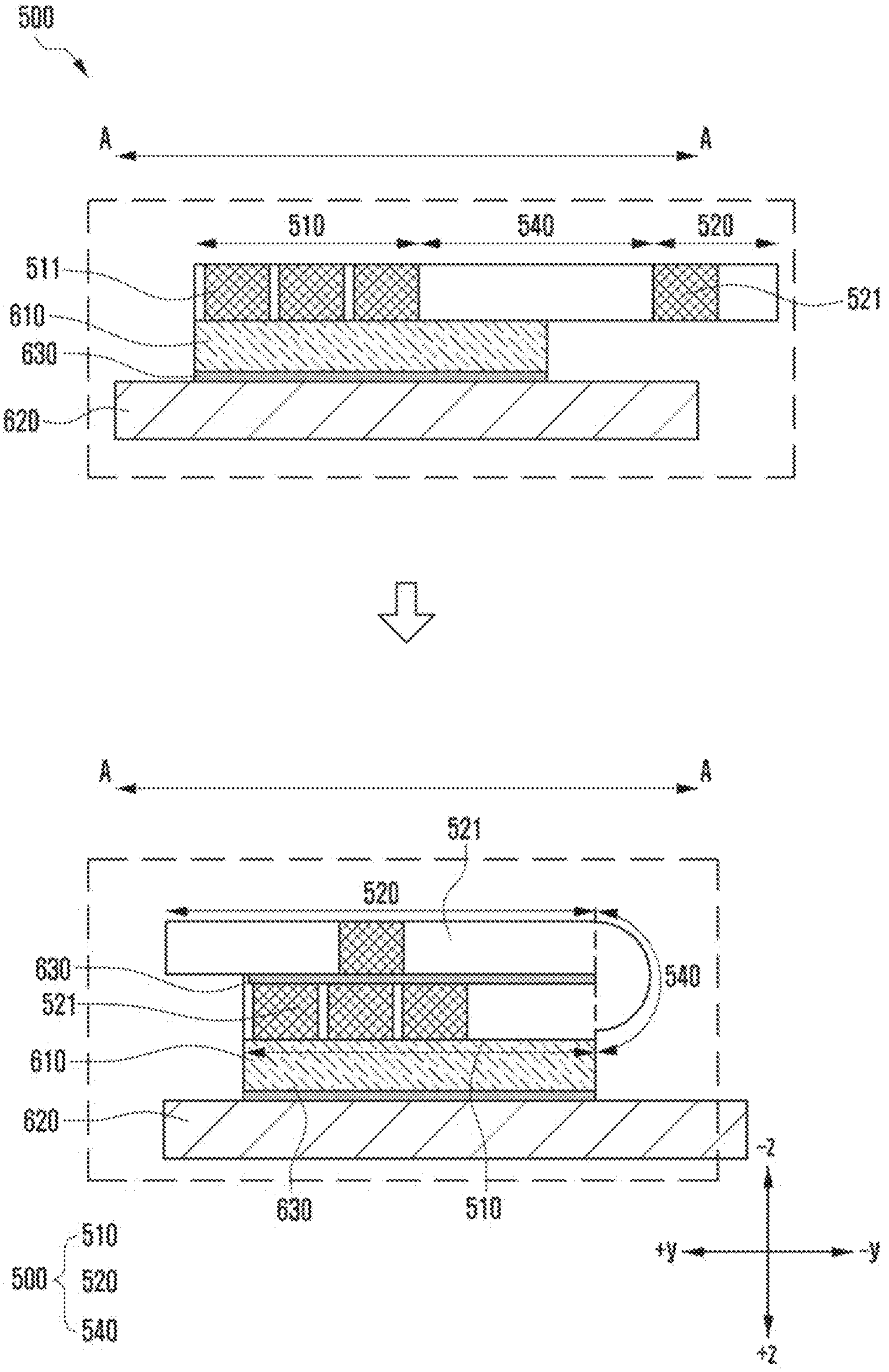
FIG. 5C is a cross-sectional view of the printed circuit board cut along line A-A of FIG. 5A.
Figure 5D:
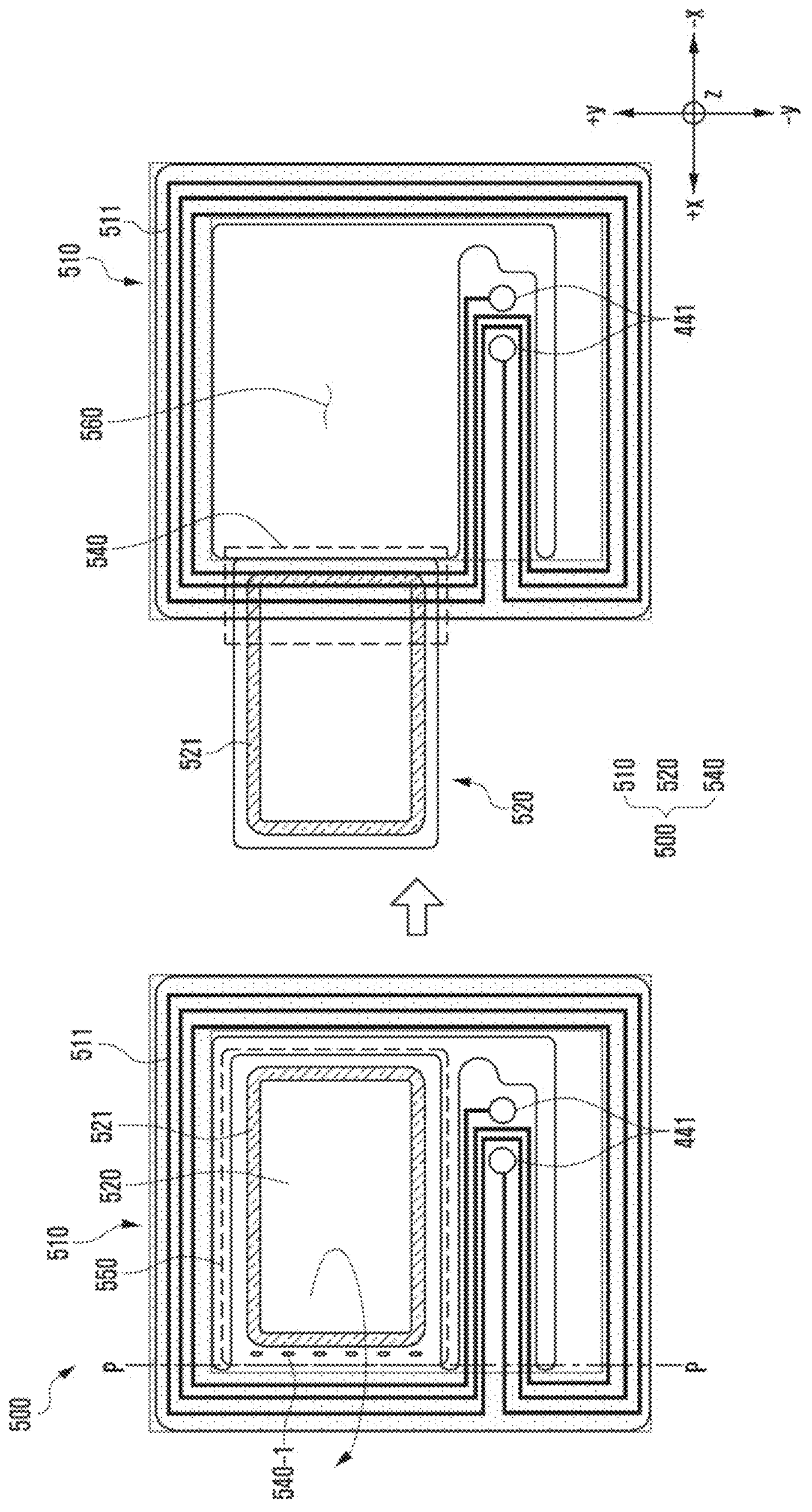
FIG. 5D is a view illustrating a printed circuit board of another embodiment different from the printed circuit board illustrated in FIG. 5B.
Figure 5E:
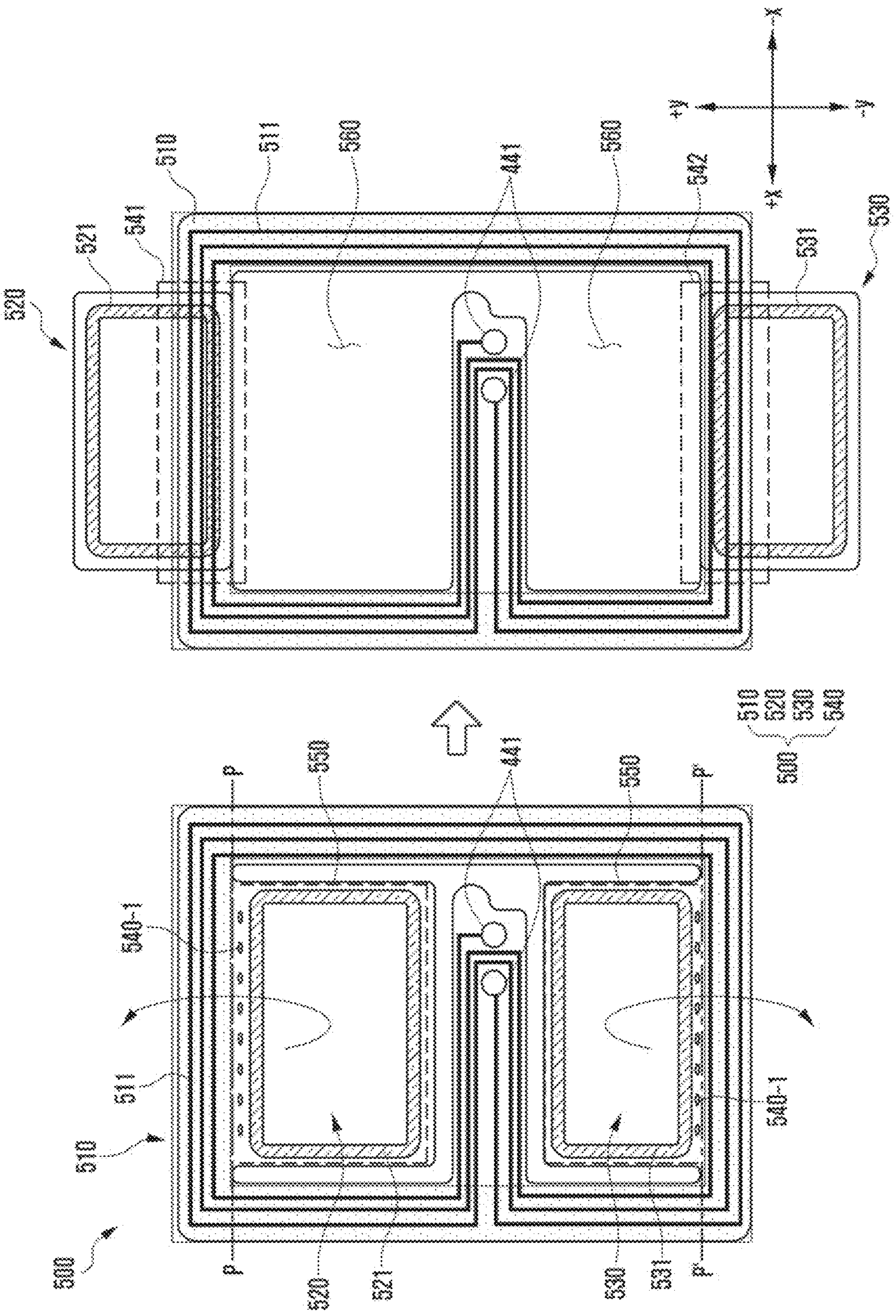
FIG. 5E is a view illustrating a printed circuit board of still another embodiment different from the printed circuit board illustrated in FIG. 5B.

FIG. 5A is a view illustrating a printed circuit board disposed on the rear surface of an electronic device according to one or more embodiments disclosed herein. FIG. 5B is a view illustrating a process of folding a printed circuit board illustrated in FIG. 5A along a folding axis P-P. FIG. 5C is a cross-sectional view of the printed circuit board cut along line A-A of FIG. 5A. FIG. 5D is a view illustrating a printed circuit board of another embodiment different from the printed circuit board illustrated in FIG. 5B. FIG. 5E is a view illustrating a printed circuit board of still another embodiment different from the printed circuit board illustrated in FIG. 5B.

An electronic device 400 (e.g., the electronic device 101 of FIG. 1 or the electronic device 300 of FIG. 3A) according to one or more embodiments disclosed herein may include a front surface plate 420, a display 430, a printed circuit board (e.g., the board 440 in FIG. 4), a support member (e.g., the first support member 410 in FIG. 4, the second support member 460 in FIG. 4, the support member 620 in FIG. 5C, the support member 820 in FIG. 6C, and/or the support member 1020 in FIG. 7A), an antenna 470 (e.g., the NFC antenna 297-3 in FIG. 2, the printed circuit board 500 in FIG. 5A, the printed circuit board 700 in FIG. 6A, or the printed circuit board 900 in FIG. 7A), or a rear surface plate 480 (e.g., a rear surface cover), which are stacked in that order. Referring to FIG. 5A, the antenna 470 may be disposed on the rear surface (e.g., the surface oriented in the −Z direction with reference to on FIG. 4) of the electronic device 400 so at to face the rear surface plate 480 to be capable of performing near-field communication with an external electronic device (e.g., the electronic device 102 in FIG. 1). For example, the antenna 470 may transmit and/or receive a near-field communication signal with an external electronic device located adjacent to the rear surface of the electronic device 400 (e.g., the electronic device 102 in FIG. 1). In some embodiments, the antenna 470 may include a radiator that is electrically connected to the communication module 190 of the electronic device 400 and transmits and/or receives radio frequency (RF) signals.

According to one or more embodiments, the antenna 470 may include a printed circuit board 500 (a flexible printed circuit board (FPCB)). The printed circuit board 500 may be disposed on and supported by a support member 620 (e.g., the first support member 411 in FIG. 4 or the second support member 460 in FIG. 4). The printed circuit board 500 may disposed on the support member 620 to be capable of transmitting/receiving wireless communication signals with an external electronic device. In an embodiment, referring to FIG. 5A, the printed circuit board 500 may be disposed adjacent to the rear surface plate 480. For example, the printed circuit board 500 may be disposed to face the rear surface plate 480 to transmit and receive wireless communication signals to and from an external electronic device located adjacent to the rear surface of the electronic device 400.

According to one or more embodiments, the printed circuit board 500 may include patterns 511, 521, and 531 including a conductive material. In an embodiment, the patterns 511, 521, and 531 may each include a coil made of a conductive material and wound a predetermined number of times. The patterns 511, 521, and 531 may be components that transmit RF signals. In an embodiment, the first pattern 511 disposed in the first antenna area 510 may be electrically connected to the communication module 190 disposed on the printed circuit board 440. Accordingly, the electronic device 400 may transmit and receive communication signals to and from an external electronic device via the patterns 511, 521, and 531 included in the printed circuit board 500.

In an embodiment, referring to FIG. 5C, the shielding member 610 may be disposed between the support member 620 and the printed circuit board 500. In some embodiments, the shielding member 610 may be disposed below the printed circuit board 500 and the support member 620 (e.g., in the +Z direction with reference to FIG. 5C). In an embodiment, the shielding member 610 may be disposed below the printed circuit board 500 (e.g., in the +Z direction with reference to FIG. 5C) to shield an electromagnetic force generated in the printed circuit board 500 and the electronic device 400 and/or noise generated by the operating frequency. For example, the shielding member 610 may be disposed below the printed circuit board 500 to shield the magnetic field generated by an external electronic device or the printed circuit board 500, thereby preventing the magnetic field generated by the external electronic device or the printed circuit board 500 from affecting the electronic components disposed inside the electronic device 400. In an embodiment, since the magnetic field generated by the external electronic device or the printed circuit board 500 cannot pass through the shielding member 610. Thus, the shielding member 610 enables smooth electromagnetic interaction between a coil of the external electronic device and the patterns 511, 521, and 531 of the printed circuit board 500. For example, the magnetic field generated by the patterns 511, 521, and 531 of the printed circuit board 500 is mainly directed toward the coil of the external electronic device through the shielding member 610, thereby enabling smooth electromagnetic interaction with the external electronic device.

According to one or more embodiments, as illustrated in FIGS. 5B and 5C, the printed circuit board 500 may include a first antenna area 510, a second antenna area 520, or a bending area 540. The first antenna area 510 may include a first pattern 511 wound a predetermined number of times. The second antenna area 520 may include a second pattern 521 wound a predetermined number of times. At least a portion of the bending area 540 may be bent to interconnect the first antenna area 510 and the second antenna area 520. However, the first antenna area 510, the second antenna area 520, or the bending area 540 are distinguished only for the convenience of explaining the printed circuit board 500 and may not be physically separated areas. In an embodiment, the first antenna area 510, the second antenna area 520, or the bending area 540 may be formed integrally. As another example, the printed circuit board 500 illustrated in FIG. 5E, which will be described later, may have a first antenna area 510, a second antenna area 520, a third antenna area 530, and/or a bending area 540 which may be integrally formed.

According to one or more embodiments, the printed circuit board 500 may include a pattern containing a conductive material and additionally disposed in an area where the patterns 511, 521, and 531 are not formed (e.g., the inner area 560 of the first antenna area 510). In an embodiment, referring to FIGS. 5B and 5C, the second antenna area 520 of the printed circuit board 500 may be positioned in the first antenna area 510. A first pattern 511 may be disposed in the first antenna area 510. A second pattern 521 may be disposed in the second antenna area 520 so as to be positioned inside the first pattern 511. Thereafter, a series of processes for expanding the physical area of the printed circuit board 500 so that the wireless communication operation range can be expanded may be as follows. In an embodiment, referring to FIGS. 5B, 5D, and 5E, the second antenna area 520 may be folded relative to the first antenna area 510 along a folding axis P-P such that at least a portion thereof is positioned outside the first antenna area 510. For example, the second antenna area 520 may be folded relative to the first antenna area 510 along the folding axis P-P from the inside to the outside of the first antenna area 510. Accordingly, at least a portion of the second pattern 521 of the second antenna area 520 may be positioned outside the first pattern 511 of the first antenna area 510. Accordingly, the wireless communication operation range of the printed circuit board 500 can be expanded as the pattern area is physically expanded. As the second antenna area 520 is folded relative to the first antenna area 510, at least a portion of the second pattern 521 may face a portion of the first pattern 511. For example, when viewed in the z-axis direction, at least a portion of the second pattern 521 may overlap a portion of the first pattern 511. In this case, the first pattern 511 and the second pattern 521 may be electromagnetically coupled. Accordingly, the second antenna area 520 may be electromagnetically connected to the first antenna area 510.

In an embodiment, since the second antenna area 520 is formed in the inner area 560 positioned inside the first antenna area 510 and then bent, the second antenna area 520 may have a size included in the first antenna area 510. For example, referring to FIG. 5B, the second antenna area 520 may have a size corresponding to the inner area 560 of the first antenna area 510.

In an embodiment, the first antenna area 510 and the second antenna area 520 may be coupled via an adhesive member 630. For example, since the adhesive member 630 is disposed in the area of the second antenna area 520 facing the first antenna area 510, the second antenna area 520 may be fixed to the first antenna area 510 in a bent state.

In an embodiment, in order to ensure that the second antenna area 520 can be folded relative to the first antenna area 510, the inner area 560 of the first antenna area 510 may be cut in a remaining surface 550 other than the surface where the folding axis P-P is formed between the first antenna area 510 and the second antenna area 510. Accordingly, the second antenna area 520 may be folded relative to the first antenna area 510 along the folding axis P-P.

In an embodiment, referring to FIGS. 5B and 5C, the bending area 540 of the printed circuit board 500 may be an area interconnecting the first antenna area 510 and the second antenna area 520. The bending area 540 may be an area where the first pattern 511 and/or the second pattern 521 is not placed. In an embodiment, multiple holes 540-1 may be formed in the bending area 540. In this case, as the second antenna area 520 is folded relative to the first antenna area 510, bending stress that may occur in the bending area 540 may be reduced. Accordingly, the second antenna area 520 can be folded more smoothly relative to the first antenna area 510.

In an embodiment, the printed circuit board 500 may transmit and receive wireless communication signals to and from an external electronic device as the first pattern 511 disposed in the first antenna area 510 is connected to a power feeder 441. The first antenna area 510 may receive power as the first pattern 511 is connected to the power feeder 441. As described above, by being electromagnetically coupled to the first antenna area 510, the second antenna area 520 may be fed with power via the first antenna area 510. In an embodiment, referring to FIG. 5C, when the second antenna area 520 is bent, a portion of the second pattern 521 may be positioned to face a portion of the first pattern 511 of the first antenna area 510. For example, the second antenna area 520 is bent relative to the first antenna area 510 along the folding axis P-P so that a portion of the second pattern 521 and a portion of the first pattern 511 can be positioned to enable coupling. In this case, as a portion of the second pattern 521 and a portion of the first pattern 511 overlap each other, the first pattern 511 and the second pattern 521 may be electromagnetically connected to each other. Accordingly, the printed circuit board 500 may transmit and receive wireless communication signals to and from an external electronic device via the first and second antenna areas 510 and 520 that are electromagnetically coupled to each other.

According to one or more embodiments, the second antenna area 520 may be folded in various directions relative to the first antenna area 510. In an embodiment, referring to FIG. 5B, the second antenna area 520 may be folded relative to the first antenna area 510 along the folding axis P-P to be positioned in the +Y direction with reference to FIG. 5B. In another embodiment, referring to FIG. 5D, the second antenna area 520 may be folded relative to the first antenna area 510 along the folding axis P-P to be positioned in the +X direction with reference to FIG. 5D. In an embodiment, the second antenna area 520 may be folded relative to the first antenna area 510 along the folding axis P-P to be positioned in various directions.

In another embodiment, referring to FIG. 5E, a third antenna area 530 may be added to the printed circuit board 500 illustrated in FIGS. 5B and 5C. The printed circuit board 500 illustrated in FIG. 5E may have a first antenna area 510, a second antenna area 520, a third antenna area 530, and/or a bending area 540. The bending area 540 may include a first bending area 541 interconnecting the first antenna area 510 and the second antenna area 520, and a second bending area 542 interconnecting the first antenna area 510 and the third antenna area 530. The second antenna area 520 may be folded relative to the first antenna area 510 along the folding axis P-P so that at least a portion thereof is positioned in the +Y direction with respect to the first antenna area 510 with reference to FIG. 5E. Accordingly, the portion of the second pattern 521 positioned in the second antenna area 520 may be positioned in the +Y direction relative to the first pattern 511 positioned in the first antenna area 510 with reference to FIG. 5E. In an embodiment, the third antenna area 530 may be folded relative to the first antenna area 510 along the folding axis P'-P' so that at least a portion thereof is positioned in the −Y direction with respect to the first antenna area 510 with reference to FIG. 5E. Accordingly, the portion of the third pattern 531 positioned in the third antenna area 530 may be positioned in the −Y direction relative to the first pattern 511 positioned in the first antenna area 510 with reference to FIG. 5E. Accordingly, since a portion of the second pattern 521 and a portion of the third pattern 531 are positioned outside the first pattern 511, the physical pattern area of the printed circuit board 500 can be expanded. Accordingly, the wireless communication operation range can be expanded.

In an embodiment, by being coupled to the first antenna area 510, the second antenna area 520 and the third antenna area 530 may be fed with power via the first antenna area 510. For example, the second antenna area 520 may be electromagnetically coupled as a portion of the second pattern 521 faces a portion of the first pattern 511 of the first antenna area 510. In an embodiment, the third antenna area 530 may be electromagnetically coupled as a portion of the third pattern 531 faces a portion of the first pattern 511 of the first antenna area 510. Accordingly, the printed circuit board 500 may transmit and receive wireless communication signals to and from an external electronic device via the first antenna area 510, the second antenna area 520, and the third antenna area 530 that are electromagnetically coupled to each other.

However, the above-described positions of the second antenna area 520 and the third antenna area 530 with respect to the first antenna area 510 are only examples, and may not limit the positions of the second antenna area 520 and the third antenna area 530. The positions of the second antenna area 520 and the third antenna area 530 with respect to the first antenna area 510 can be variously changed within the scope that can be implemented by a person ordinarily skilled in the art. In an embodiment, in the printed circuit board 500, the number of patterns placed inside the first pattern 511 of the first antenna area 510 can be variously changed within a range that can utilize the area positioned inside the first antenna area 510. Accordingly, the antenna areas positioned inside the first antenna area 510 may be distinguished according to the number of coils. In an embodiment, the antenna area positioned inside the first antenna area 510 may be folded relative to the first antenna area 510 such that a portion of the antenna area positioned inside the first antenna area 510 is directed to the outside of the first antenna area 510.

According to one or more embodiments disclosed herein, by additionally placing patterns (e.g., the second pattern 521 and the third pattern 531) in the areas of the printed circuit board 500 where patterns made of a conductive material are not placed (e.g., the inner area of the first antenna area 510 or the second antenna area 520), the remaining area of the printed circuit board 500 may be utilized. In an embodiment, the printed circuit board 500 may be folded relative to the first antenna area along folding axes P-P and P'-P' such that at least a portion of the second antenna area 520 and/or the third antenna area 530 positioned inside the first antenna area 510 is positioned outside the first antenna area 510. As the second antenna area 520 and/or the third antenna area 530 is folded relative to the first antenna area 510, a portion of the pattern positioned in the second antenna area 520 and/or the third antenna area 530 (e.g., the second pattern 521 or the third pattern 531) may face a portion of the first pattern 511 of the first antenna area 510. Accordingly, the second antenna area 520 and/or the third antenna area 530 may be electromagnetically coupled to the first antenna area 510. In an embodiment, in the second pattern 521 of the second antenna area 520 and/or the third pattern 531 of the third antenna area 530, the remaining area except for the areas facing the first pattern 511 of the first antenna area 510 may be positioned outside the first pattern 511. Accordingly, since the physical range of the patterns used for transmission and/or reception with an external electronic device is expanded, the wireless communication operating range of the printed circuit board 500 can be increased.

Figure 6A:
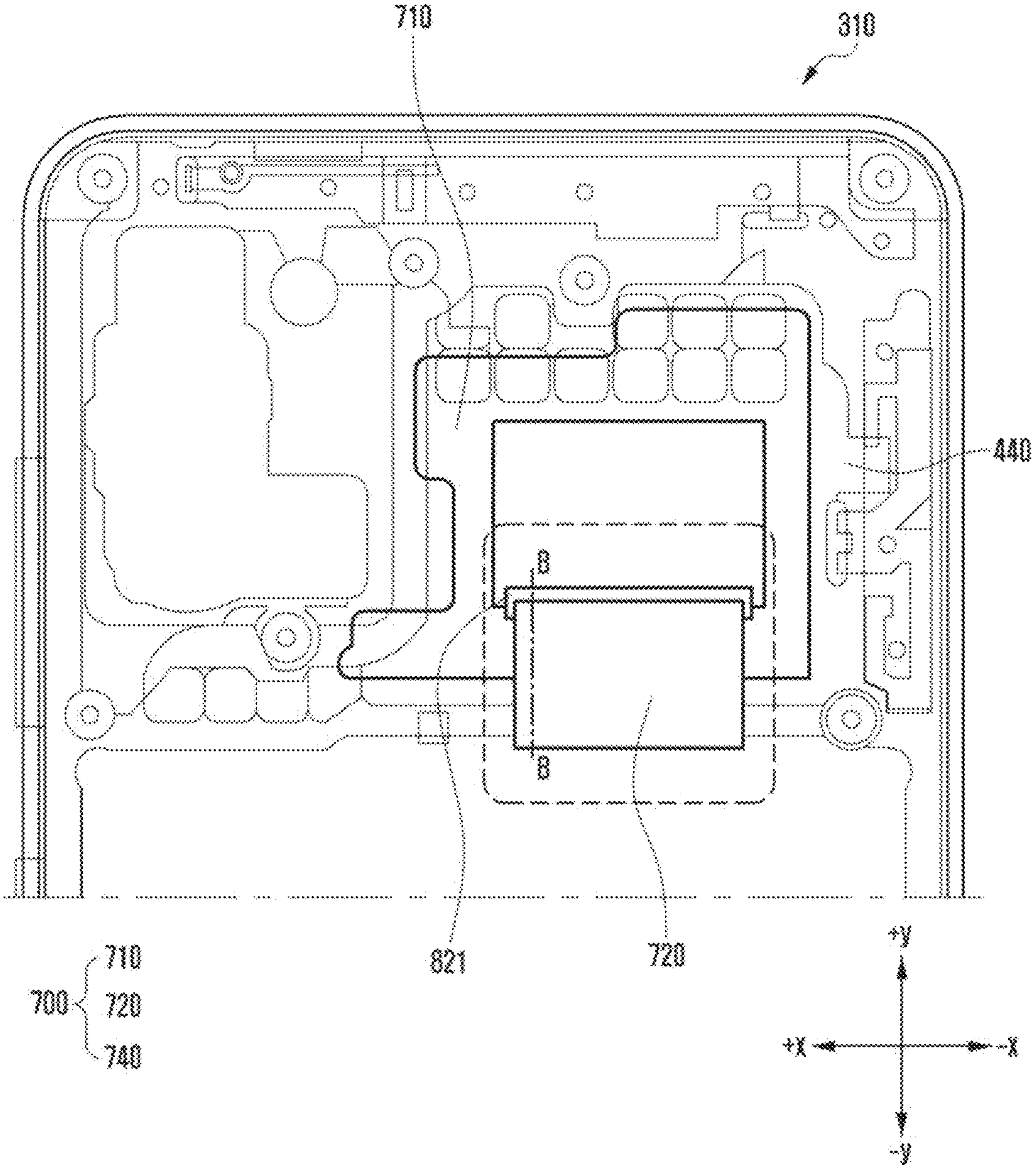
FIG. 6A is a view illustrating a state in which a printed circuit board of another embodiment different from the printed circuit board of FIG. 5A is disposed on the rear surface of an electronic device.
Figure 6B:
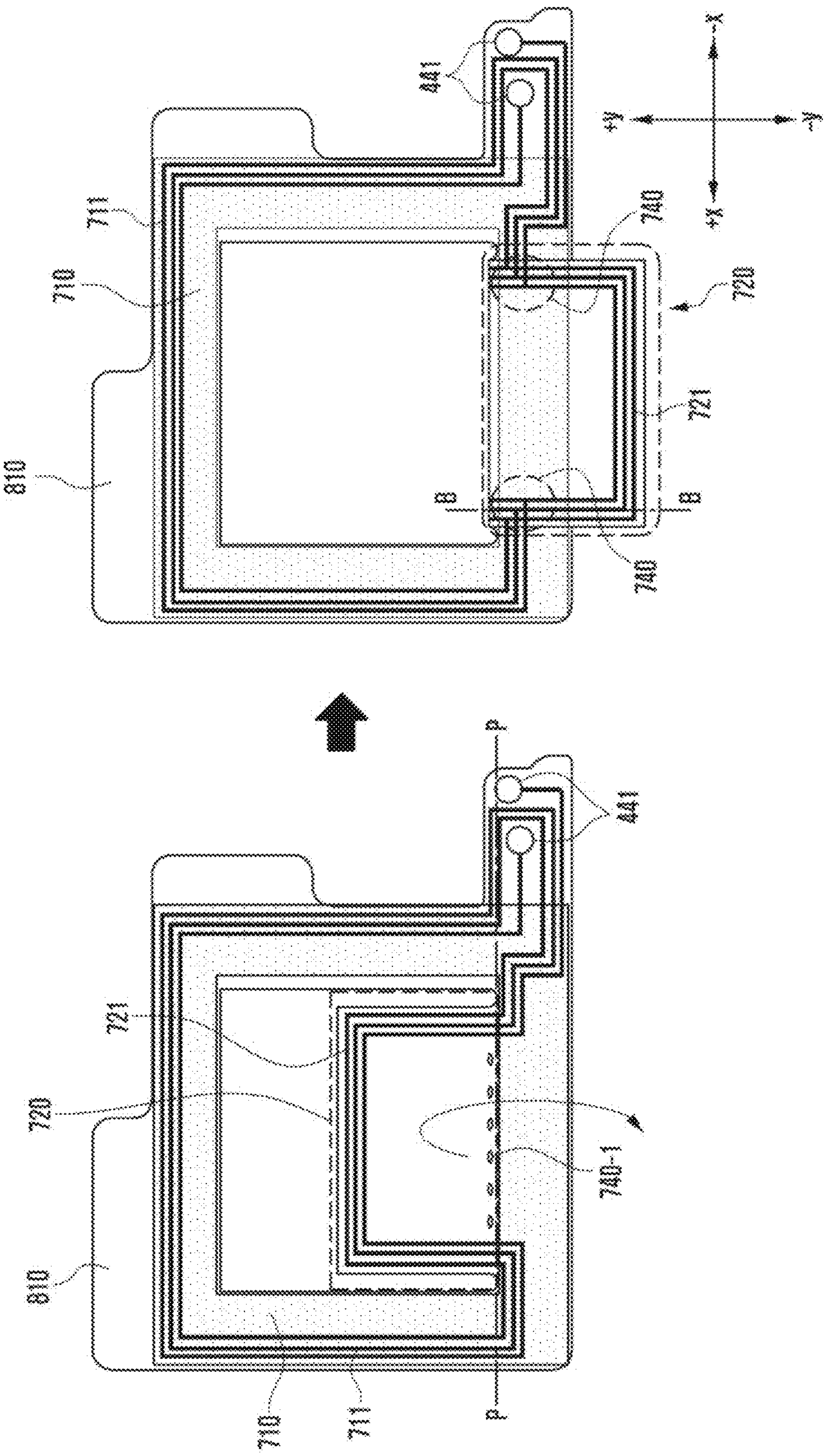
FIG. 6B is a view illustrating a process of folding the printed circuit board illustrated in FIGS. 6A and 6B along a folding axis P-P.
Figure 6C:
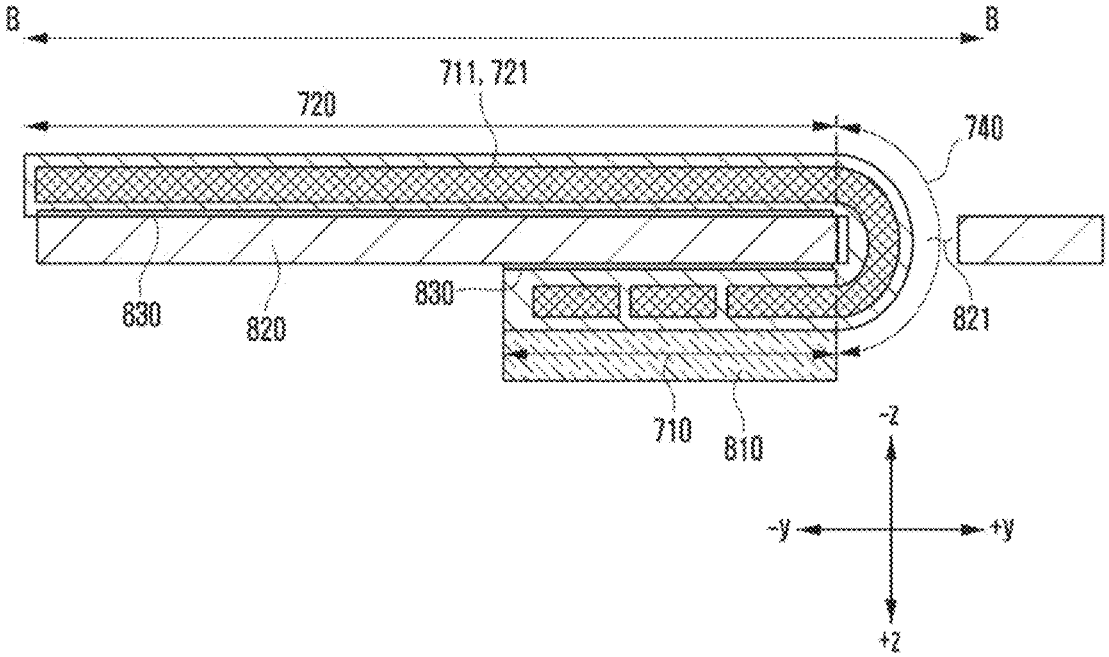
FIG. 6C is a cross-sectional view of the printed circuit board cut along line B-B in FIG. 6A.
Figure 6D:
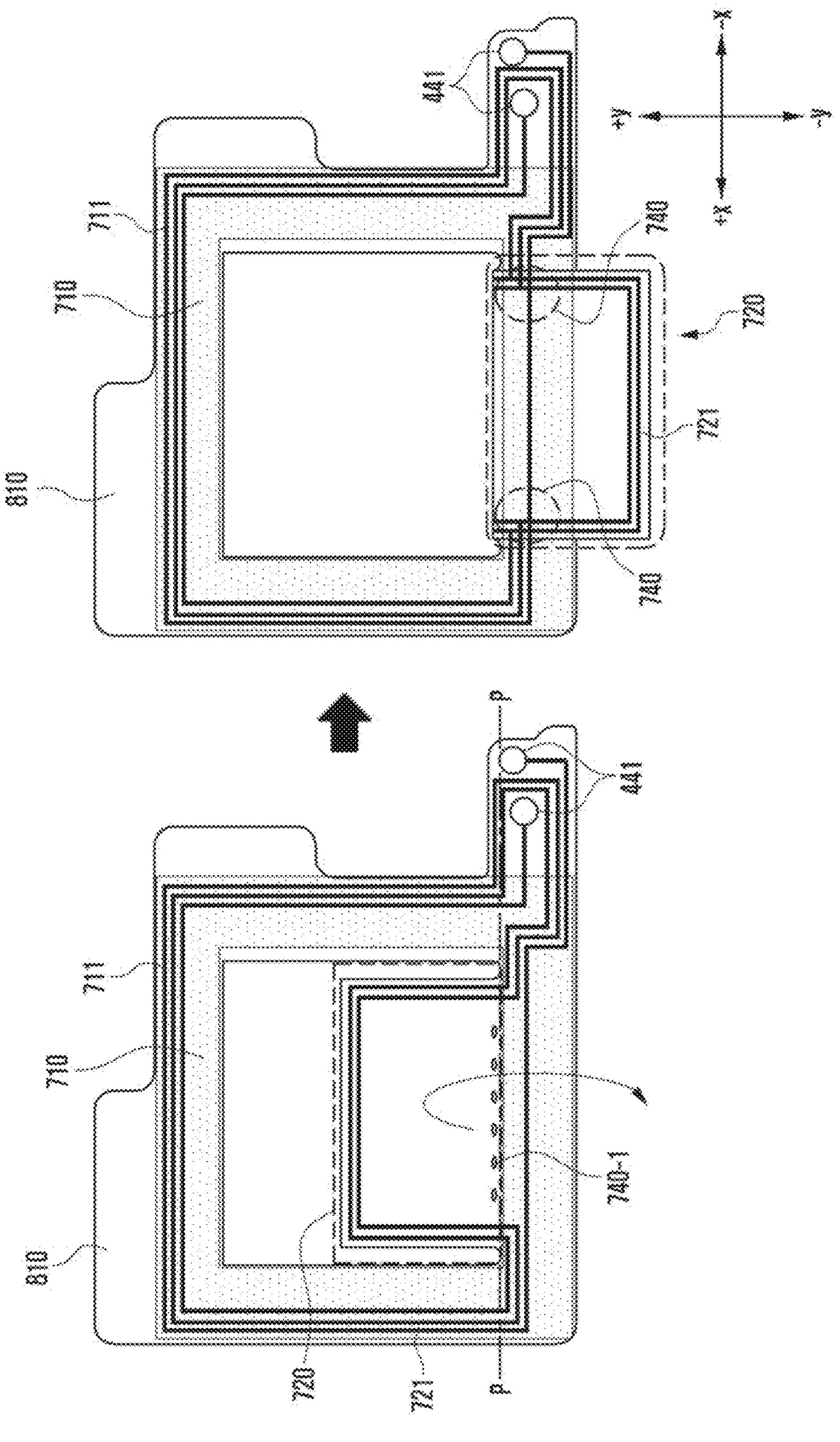
FIG. 6D is a view illustrating a printed circuit board of another embodiment different from the printed circuit board illustrated in FIG. 6A.

FIG. 6A is a view illustrating a state in which a printed circuit board of an embodiment different from the printed circuit board of FIG. 5A is disposed on the rear surface of an electronic device. FIG. 6B is a view illustrating a process of folding the printed circuit board illustrated in FIG. 6A along a folding axis P-P. FIG. 6C is a cross-sectional view of the printed circuit board cut along line B-B in FIGS. 6A and 6B. FIG. 6D is a view illustrating a printed circuit board of an embodiment different from the printed circuit board illustrated in FIG. 6A.

The printed circuit board 700 illustrated in FIGS. 6A to 6D may be a printed circuit board 700 of an embodiment different from the printed circuit board 500 previously described with reference to FIGS. 5A to 5E. Hereinafter, since components the same as or similar to those of the printed circuit board 500 described above are included, detailed descriptions of overlapping components will be omitted, and the same or similar components will be described using the same reference numerals unless necessary.

According to one or more embodiments, as illustrated in FIGS. 6B and 6C, the printed circuit board 700 includes a first pattern 711 of the first antenna area 710 and a second pattern 721 of the second antenna area 720, which may be formed integrally. For example, the second antenna area 720 may be an area folded relative to the first antenna area 719 along a folding axis P-P such that at least a portion of the area placed inside the first antenna area 710 is positioned outside the first antenna area 710. The second antenna area 720 may be connected to the first antenna area 710 via a bending area 740. In an embodiment, referring to FIGS. 6B and 6C, the first pattern 711 disposed in the first antenna area 710 may be disposed to extend to the second antenna area 720 positioned inside the first antenna area 710. Hereinafter, for the convenience of explanation, the first pattern 711 extending into the second antenna area 720 will be described as a second pattern 721.

In an embodiment, a series of processes for expanding the physical pattern area positioned within the printed circuit board 700 so that the wireless communication operation range can be expanded may be as follows. Referring to FIGS. 6B and 6C, the first pattern 711 in which a coil is wound a predetermined number of times may be formed in the first antenna area 710. The first pattern 711 may extend to the second antenna area 720 positioned inside the first antenna area 710. The second pattern 721 extending into the second antenna area 720 (e.g., an extension of the first pattern 711) may extend from the first pattern 711 and may be formed as a second pattern 721 that is wound the same number of times as the first pattern 711. The second antenna area 720 may be folded relative the first antenna area 710 from the inside to the outside of the first antenna area 710 along a folding axis P-P such that at least a portion thereof is positioned outside the first antenna area 710. Accordingly, at least a portion of the second pattern 721 may be positioned outside the first antenna area 710. As the second pattern 721 is positioned from the inside to the outside of the first antenna area 710, the pattern area of the printed circuit board 700 may be expanded. Accordingly, the wireless communication operation range of the printed circuit board 700 may be expanded.

In an embodiment, referring to FIGS. 6B and 6C, the bending area 740 of the printed circuit board 700 may be an area interconnecting the first antenna area 710 and the second antenna area 720. At least a portion of the first pattern 711 and/or the second pattern 721 may be disposed in the bending area 740.

In an embodiment, multiple holes 740-1 may be formed in the bending area 740 except for the area where the second pattern 721 is positioned. In this case, as the second antenna area 720 is folded relative to the first antenna area 710, bending stress that may occur in the bending area 740 may be reduced. Accordingly, the second antenna area 720 can be folded more smoothly relative to the first antenna area 710.

According to one or more embodiments, as illustrated in FIG. 6C, the printed circuit board 700, a shielding member 810, and a support member 820 (e.g., the first support member 410 in FIG. 4, the second support member 460 in FIG. 4, the support member 620 in FIG. 5C, and/or the support member 1020 in FIG. 7A) may be stacked in the order of the second antenna area 720 of the printed circuit board 700, the support member 820, the first antenna area 710 of the printed circuit board 700, and the shielding member 810 in the z-axis direction (e.g., the Z-axis direction with reference to FIG. 6C). The support member 820 may be coupled to the first antenna area 710 and the second antenna area 720 via an adhesive member 830. In an embodiment, the support member 820 may support the printed circuit board 700. Referring to FIGS. 6A and 6C, the support member 820 may include an opening 821 through which at least a portion of the printed circuit board 700 passes. For example, the bending area 740 of the printed circuit board 700 may pass through the opening 821.

In an embodiment, at least a portion of the support member 820 may be positioned between the first antenna area 710 and the second antenna area 720. The bending area 740 may extend from the first antenna area 710 to the second antenna area 720 through the opening 821 of the support member 820. In this case, the radius of curvature of the bending area 740 may be increased compared to that in the case where the first antenna area 710 and the second antenna area 720 directly face each other. Accordingly, bending stress in the bending area 740 of the printed circuit board 700 may be reduced. In an embodiment, when viewed in the z-axis direction, a portion of the support member 820 that overlaps the first antenna area 710 and the second antenna area 720 may include a non-conductive material.

In another embodiment, referring to FIG. 6D, only a portion of the first pattern 711 wound a predetermined number of times may extend into the second antenna area 720. In this case, the numbers of turns of the coil may differ between the first pattern 711 and the second pattern 721. For example, the first pattern 711 may be a pattern in which the coil is wound three times, and the second pattern 721 may be a pattern in which the coil extending from the coil included in the first pattern 711 is wound twice.

According to one or more embodiments disclosed herein, in the printed circuit board 700, the first pattern 711 may extend into an area where no pattern is disposed (e.g., the inner area of the first antenna area 710 or the second antenna area 720). The second pattern 721 formed integrally with the first pattern 711 may be positioned in the second antenna area 720 positioned inside the first antenna area 710. In the printed circuit board 700, the second antenna area 720 may be folded relative to the first antenna area 710 along the folding axis P-P such that a portion of the second pattern 721 is positioned outside the first pattern 711. Accordingly, in the printed circuit board 700, as a portion of the second pattern 721 of the printed circuit board 700 is positioned outside the first antenna area 710, the physical pattern area may be expanded, thereby expanding the wireless communication operation range.

Figure 7A:
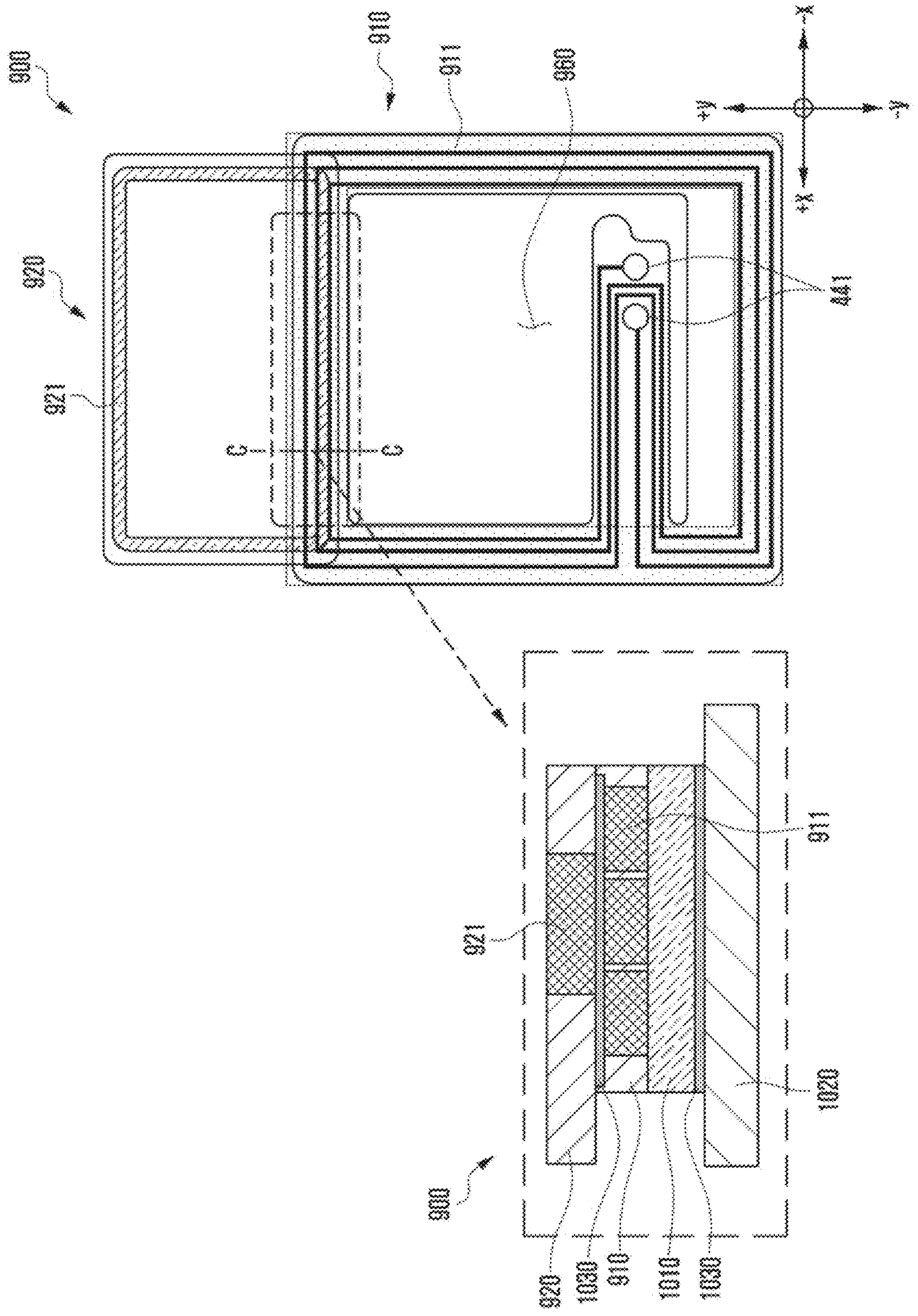
FIGS. 7A and 7B are views illustrating a printed circuit board of an embodiment different from the printed circuit boards described with reference to FIGS. 5A to 6D.
Figure 7B:
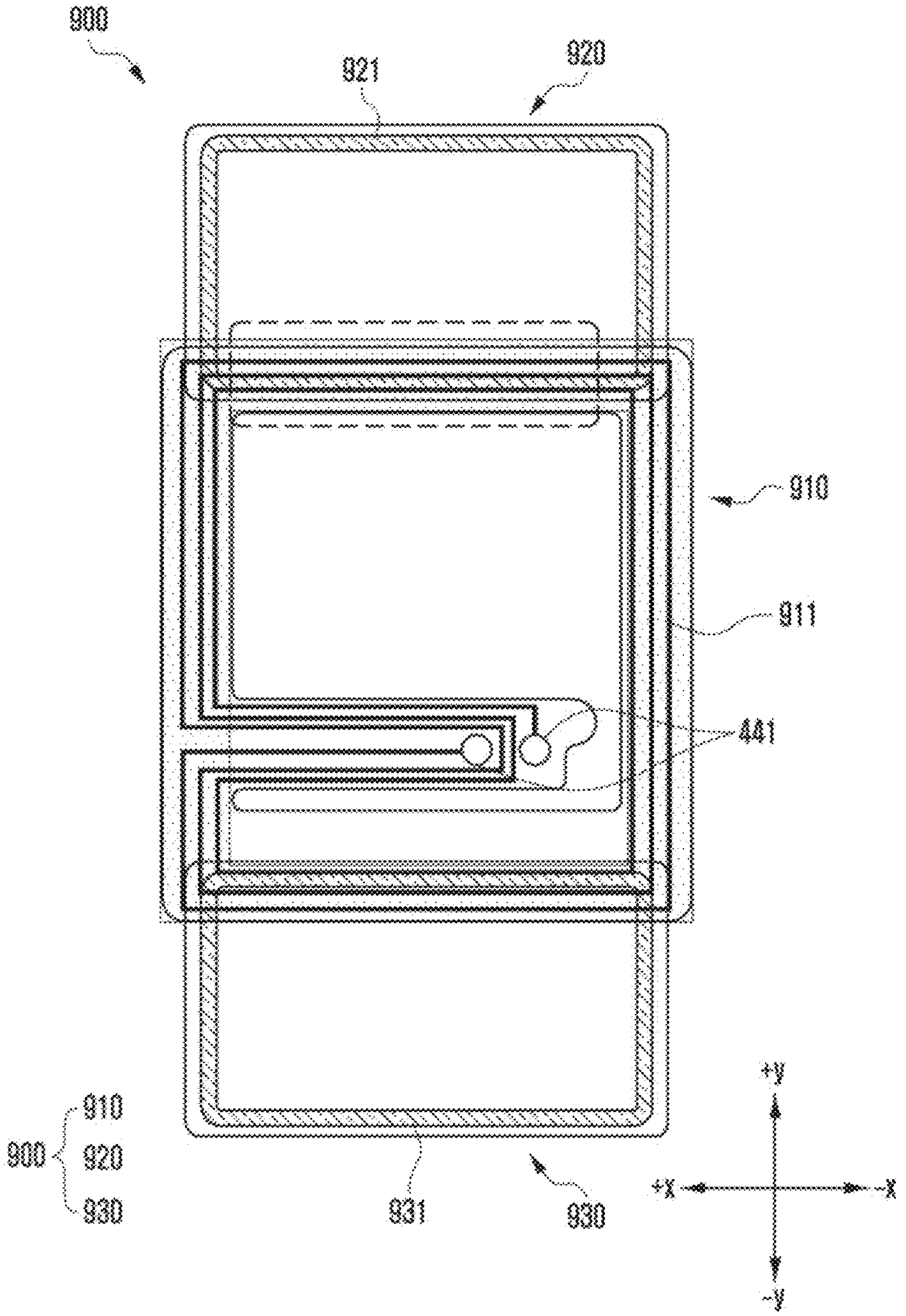

FIGS. 7A and 7B are views illustrating a printed circuit board of an embodiment different from the printed circuit boards described with reference to FIGS. 5A to 6D.

The printed circuit board 900 illustrated in FIGS. 7A and 7B may be a printed circuit board 900 of an embodiment different from the printed circuit boards previously described with reference to FIGS. 5A to 6B (e.g., the printed circuit board 500 in FIG. 5A or the printed circuit board 700 in FIG. 6A). Hereinafter, since components the same as or similar to those of the printed circuit boards 500 and 700 described above are included, detailed descriptions of overlapping components will be omitted, and the same or similar components will be described using the same reference numerals unless necessary.

According to one or more embodiments, as illustrated in FIG. 7A, the printed circuit board 900 may include a first antenna area 910 and a second antenna area 920 that are formed separately. The first antenna area 910 may include a first pattern 911 wound a predetermined number of times. The second antenna area 920 may include a second pattern 921 wound a predetermined number of times. In an embodiment, referring to FIG. 7A, the printed circuit board 900, a shielding member 1010, and a support member 1020 (e.g., the first support member 410 in FIG. 4, the second support member 460 in FIG. 4, the support member 620 in FIG. 5C, and/or the support member 820 in FIG. 6C) may be stacked in the order of the second antenna area 920, the first antenna area 910, the shielding member 1010, and the support member 1020 in the z-axis direction. In an embodiment, the printed circuit board 900, the shielding member 1010, and the support member 1020 may be stacked in the order of the first antenna area 910, the second antenna area 920, the shielding member 1010, and the support member 1020 in the z-axis direction.

According to one or more embodiments, as illustrated in FIGS. 7A and 7B, the first antenna area 910 and the second antenna area 920 may be formed separately and coupled via an adhesive member 1030 such that a portion of the first pattern 911 and a portion of the second pattern 921 face each other. In the second antenna area 920, the remaining area except for the area facing the first antenna area 910 may be positioned outside the first antenna area 910. Accordingly, at least a portion of the second pattern 921 of the second antenna area 920 may be positioned outside the first pattern 911 of the first antenna area 910. Accordingly, in the printed circuit board 900, as the physical pattern area is expanded via the second pattern 921, the wireless communication operation range can be expanded.

According to one or more embodiments, as illustrated in FIGS. 7A and 7B, as the first pattern 911 disposed in the first antenna area 910 is connected to a power feeder 441, the printed circuit board 900 may transmit and receive wireless communication signals to and from an external electronic device (e.g., the electronic device 102 in FIG. 1). The first antenna area 910 may receive power as the first pattern 911 is connected to the power feeder 441. By being electromagnetically coupled to the first antenna area 910, the second antenna area 920 may be fed with power via the first antenna area 910. In an embodiment, referring to FIG. 7A, the second antenna area 920 may be coupled with the first antenna area 910 via an adhesive member 1030 such that a portion of the second pattern 921 faces a portion of the first pattern 911 of the first antenna area 910. In this case, as a portion of the second pattern 921 and a portion of the first pattern 911 face each other, the first pattern 911 and the second pattern 921 may be electromagnetically connected to each other. Accordingly, the printed circuit board 900 may transmit and receive wireless communication signals to and from an external electronic device via the first and second antenna areas 910 and 920 that are electromagnetically coupled to each other.

Referring to FIG. 7B, the printed circuit board 900 may include a separately formed first antenna area 910, second antenna area 920, or third antenna area 930. The third antenna area 930 may include a third pattern 931 wound a predetermined number of times. In an embodiment, the second antenna area 920 may be coupled to the first antenna area 910 via the adhesive member 1030 such that at least a portion of the second antenna area 920 is positioned in the +Y or −Y direction with respect to the first antenna area 910. For example, at least a portion of the second pattern 921 of the second antenna area 920 may be positioned in the +Y direction with respect to the first pattern 911 of the first antenna area 910 with reference to FIG. 7B. In an embodiment, the third antenna area 930 may be coupled to the first antenna area 910 via an adhesive member 1030 such that at least a portion of the third antenna area 930 is positioned in the +Y or −Y direction with respect to the first antenna area 910. For example, at least a portion of the third pattern 931 of the third antenna area 930 may be positioned in the −Y direction with respect to the first pattern 911 of the first antenna area 910 with reference to FIG. 7B. Accordingly, the pattern area of the printed circuit board 900 may be expanded via the second pattern 921 and the third pattern 931, and the wireless communication operation range may be expanded.

In an embodiment, by being coupled to the first antenna area 910, the second antenna area 920 and the third antenna area 930 may be fed with power via the first antenna area 910. For example, the second antenna area 920 may be electromagnetically coupled as a portion of the second pattern 921 faces a portion of the first pattern 911 of the first antenna area 910. In an embodiment, the third antenna area 930 may be electromagnetically coupled as a portion of the third pattern 931 faces a portion of the first pattern 911 of the first antenna area 910. Accordingly, the printed circuit board 900 may transmit and receive wireless communication signals to and from an external electronic device via the first antenna area 910, the second antenna area 920, and the third antenna area 930 that are electromagnetically coupled to each other. In an embodiment, the wireless communication operation range of the printed circuit board 900 may be expanded as the pattern area of the printed circuit board 900 is physically expanded via the second pattern 921 and the third pattern 931.

However, the above-described positions of the second antenna area 920 and the third antenna area 930 with respect to the first antenna area 910 are only examples, and may not limit the positions of the second antenna area 920 and the third antenna area 930. In an embodiment, the number of antenna areas formed separately from the first antenna area 910 and coupled with the first antenna area 910 may vary.

In the foregoing paragraphs, the printed circuit boards 500, 700, and 900 may be used as radiators for short-range wireless communication antennas such as the MST antenna 297-1, the NFC antenna 297-3, or the wireless charging antenna 297-5. In some cases, the printed circuit boards 500, 700, and 900 may be antenna radiators used for communication in various frequency bands as well as short-range communication. The printed circuit boards 500, 700, and 900 are electrically connected to a communication module 190 disposed on the printed circuit board 440 of the electronic device 400 to transmit or receive communication signals (e.g., RF signals) to or from an external electronic device.

According to one or more embodiments disclosed herein, an electronic device 400 (e.g., the electronic device 101 of FIG. 1 or the electronic device 300 of FIG. 3A) may include a housing 310, a display 430 (e.g., the display module 160 in FIG. 1 or the display 301 in FIG. 3A) disposed on the front surface of the housing (e.g., the surface oriented in the +Z direction with reference to FIG. 4), a shielding member (e.g., the shielding member 610 in FIG. 5C or the shielding member 810 in FIG. 6C) disposed inside the housing, a printed circuit board (e.g., the printed circuit board 500 of FIG. 5A or the printed circuit board 700 of FIG. 6A) including a first antenna area (e.g., the first antenna area 510 in FIG. 5B or the first antenna area 710 in FIG. 6B) including a first pattern (e.g., the first pattern 511 in FIG. 5B or the first pattern 711 in FIG. 6B), a second antenna area (e.g., the second antenna area 520 in FIG. 5B or the second antenna area 720 in FIG. 6B) including a second pattern (e.g., the second pattern 521-2 in FIG. 5B or the second pattern 721 in FIG. 6B), and a bending area (e.g., the bending area 540 in FIG. 5C or the bending area 740 in FIG. 6C) at least partially bent to interconnect the first antenna area and the second antenna area, wherein the printed circuit board is disposed on the shielding member, and a rear surface plate 480 disposed on the rear surface (e.g., the surface oriented in the −Z direction with reference to FIG. 4) of the housing and covering the printed circuit board. The second pattern may extend to the outside of the first pattern and may at least partially face a portion of the first pattern.

In an embodiment, the second antenna area may be formed integrally with the first antenna area and folded from the inside to the outside of the first antenna area.

In an embodiment, the second antenna area may be electromagnetically connected to the first antenna area, with at least a portion of the second pattern facing a portion of the first pattern in the first antenna area.

In an embodiment, the bending area of the printed circuit board may include at least one hole 540-1.

In an embodiment, the second antenna area may have a size included in the first antenna area.

In an embodiment, the electronic device may further include a support member 620 or 820 on which at least a portion of the printed circuit board is disposed, and the support member may include an opening 821 through which the bending area of the printed circuit board passes.

In an embodiment, the first pattern and the second pattern may be integrally provided in the printed circuit board. In an embodiment, the first pattern and the second pattern may be integrated to the printed circuit board In an embodiment, at least a portion of the second pattern of the printed circuit board may be disposed in the bending area, and the bending area may include a hole 740-1 provided in the remaining area other than the area where the second pattern is disposed.

In an embodiment, the electronic device may further include a printed circuit board 440 including a communication module 190, and the first pattern of the first antenna area may be connected to the printed circuit board.

In an embodiment, the first antenna area and the second antenna area may further include an adhesive member 630 or 830 that bonds surfaces of the first and second antenna areas facing each other.

In an embodiment, the shielding member may be configured to shield noise generated by electromagnetic force and/or operating frequency of the printed circuit board.

A printed circuit board (e.g., the printed circuit board 500 in FIG. 5A or the printed circuit board 700 in FIG. 6A) according to one or more embodiments disclosed herein may include a first antenna area (e.g., the first antenna area 510 in FIG. 5B or the first antenna area 710 in FIG. 6B) disposed on a shielding member (e.g., the shielding member 610 in FIG. 5C or the shielding member 810 in FIG. 6C) included in an electronic device and including a first pattern (e.g., the first pattern 511 in FIG. 5B or the first pattern 711 in FIG. 6B), a second antenna area (e.g., the second antenna area 520 in FIG. 5B or the second antenna area 720 in FIG. 6B) including a second pattern (e.g., the second pattern 521-2 in FIG. 5B or the second pattern 721 in FIG. 6B) that extends to the outside of the first pattern and at least partially faces a portion of the first pattern as the second antenna area is folded from the inside to the outside of the first antenna area, and a bending area (e.g., the bending area 540 in FIG. 5C or the bending area 740 in FIG. 6C) at least partially bent to interconnect the first antenna area and the second antenna area.

In an embodiment, the second antenna area may be formed integrally with the first antenna area and folded from the inside to the outside of the first antenna area.

In an embodiment, the second antenna area may be electromagnetically connected to the first antenna area, with at least a portion of the second pattern facing a portion of the first pattern in the first antenna area.

In an embodiment, the bending area of the printed circuit board may include at least one hole 540-1.

In an embodiment, the second antenna area may have a size included in the first antenna area.

In an embodiment, the electronic device may further include a support member 620 or 820 on which at least a portion of the printed circuit board is disposed, and the support member may include an opening 821 through which the bending area of the printed circuit board passes.

In an embodiment, the first pattern and the second pattern may be integrally provided in the printed circuit board. In an embodiment, the first pattern and the second pattern may be integrated to the printed circuit board.

In an embodiment, at least a portion of the second pattern of the printed circuit board may be disposed in the bending area, and the bending area may include a hole 740-1 provided in the remaining area other than the area where the second pattern is disposed.

A method of manufacturing a printed circuit board (e.g., the printed circuit board 500 in FIG. 5A or the printed circuit board 700 in FIG. 6A) according to one or more embodiments disclosed herein may include forming a first pattern (e.g., the first pattern 511 in FIG. 5B or the first pattern 711 in FIG. 6B) in a first antenna area (e.g., the first antenna area 510 in FIG. 5B or the first antenna area 710 in FIG. 6B), and forming a second pattern (e.g., the second pattern 521-2 in FIG. 5B or the second pattern 721 in FIG. 6B) in a second antenna area (e.g., the second antenna area 520 in FIG. 5B or the second antenna area 720 in FIG. 6B), wherein the second antenna area are formed integrally with and located inside the first antenna area, forming at least one hole 540-1 or 740-1 in an area, which interconnects the first antenna area and the second antenna area, and in which neither the first pattern or the second pattern is disposed in a bending area (e.g., the bending area 540 in FIG. 5C or the bending area 740 in FIG. 6C), and bending the second antenna area from the inside to the outside of the first antenna area such that the second pattern extends to the outside of the first pattern and at least partially faces a portion of the first pattern.

The embodiments may be described and illustrated in terms of blocks, as shown in the drawings, which carry out a described function or functions. These blocks, which may be referred to herein as the power management module 188, the wireless communication module 192, the antenna module 197, the MST communication module 210, the NFC communication module 230, the wireless charging module 250 or the like may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein). The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

What is claimed is:

1. An electronic device comprising:

a housing comprising a front surface and a rear surface;

a display on the front surface of the housing;

a shielding member being inside the housing;

a printed circuit board on the shielding member, comprising:

a first antenna area including a first pattern, a second antenna area including a second pattern that is different and separate from the first pattern, and a bending area, which is at least partially bent along a folding axis to interconnect the first antenna area and the second antenna area; and a rear surface plate on the rear surface of the housing to cover the printed circuit board, wherein the second pattern extends to outside of the first pattern and at least partially faces a portion of the first pattern, and wherein the bending area of the printed circuit board comprises a plurality of holes that are aligned along the folding axis.

2. The electronic device of claim 1, wherein the second antenna area is formed integrally with the first antenna area and is folded from inside of the first antenna area to outside of the first antenna area.

3. The electronic device of claim 1, wherein the second antenna area is electromagnetically connected to the first antenna area, and at least a portion of the second pattern faces a portion of the first pattern in the first antenna area.

4. The electronic device of claim 1, wherein the second antenna area is included in the first antenna area.

5. The electronic device of claim 1, further comprising a support member on which at least a portion of the printed circuit board is disposed, wherein the support member comprises an opening through which the bending area of the printed circuit board passes.

6. The electronic device of claim 1, wherein the first pattern and the second pattern are integrated to the printed circuit board.

7. The electronic device of claim 6, wherein at least a portion of the second pattern of the printed circuit board is disposed in the bending area, and wherein the bending area comprises a hole in an area other than the area where the second pattern is disposed.

8. The electronic device of claim 1, wherein the printed circuit board further comprises a communication circuit, and wherein the first pattern of the first antenna area is connected to the printed circuit board.

9. The electronic device of claim 1, further comprising an adhesive member that bonds surfaces of the first antenna area and the second antenna area facing each other.

10. The electronic device of claim 1, wherein the shielding member is configured to shield noise generated by electromagnetic force and/or operating frequency of the printed circuit board.

11. A printed circuit board comprising:

a first antenna area on a shielding member included in an electronic device and comprising a first pattern;

a second antenna area comprising a second pattern that extends to outside of the first pattern and at least partially faces a portion of the first pattern as the second antenna area is folded from inside to outside of the first antenna area; and a bending area at least partially bent along a folding axis to interconnect the first antenna area and the second antenna area, wherein the second pattern is different and separate from the first pattern, and wherein the bending area comprises a plurality of holes that are aligned along the folding axis.

12. The electronic device of claim 11, wherein the second antenna area is formed integrally with the first antenna area and folded from inside to outside of the first antenna area, and wherein at least a portion of the second pattern faces a portion of the first pattern in the first antenna area and is electromagnetically connected with the first antenna area.

13. The electronic device of claim 11, wherein the first pattern and the second pattern are integrated to the printed circuit board, wherein at least a portion of the second pattern of the printed circuit board is disposed in the bending area, and wherein the bending area comprises a hole provided in an area other than the area where the second pattern is disposed.

* * * * *